(12) United States Patent
Shirasaki et al.

(10) Patent No.: US 11,303,261 B2
(45) Date of Patent: Apr. 12, 2022

(54) CIRCUIT BOARD

(71) Applicant: TOPPAN PRINTING CO.,LTD., Tokyo (JP)

(72) Inventors: Tomoyuki Shirasaki, Tokyo (JP); Hironori Nomura, Tokyo (JP); Noriko Kanou, Tokyo (JP); Susumu Maniwa, Tokyo (JP); Jun Onohara, Tokyo (JP)

(73) Assignee: TOPPAN PRINTING CO., LTD., Tokyo (JP)

(*) Notice: Subject to any disclaimer, the term of this patent is extended or adjusted under 35 U.S.C. 154(b) by 0 days.

(21) Appl. No.: 17/100,101

(22) Filed: Nov. 20, 2020

(65) Prior Publication Data

US 2021/0143787 A1    May 13, 2021

Related U.S. Application Data

(63) Continuation of application No. PCT/JP2019/020449, filed on May 23, 2019.

(30) Foreign Application Priority Data

May 24, 2018  (JP) .............................. JP2018-099705

(51) Int. Cl.
*H03H 7/01* (2006.01)
*H05K 1/16* (2006.01)
(Continued)

(52) U.S. Cl.
CPC ........ *H03H 7/0138* (2013.01); *H03H 7/0115* (2013.01); *H03H 7/463* (2013.01); *H05K 1/165* (2013.01); *H05K 3/46* (2013.01)

(58) Field of Classification Search
CPC .................... H03H 2001/0085; H03H 7/0115
(Continued)

(56) References Cited

U.S. PATENT DOCUMENTS 9,401,353 B2   7/2016  Ramachandran et al.
9,425,761 B2   8/2016  Zuo et al.
(Continued)

FOREIGN PATENT DOCUMENTS

JP   2005-268447 A   9/2005
JP   2015-070169 A   4/2015
(Continued)

OTHER PUBLICATIONS

European Extended Search Report from EP 19807888.3.0 dated May 31, 21(10 pages).
(Continued)

*Primary Examiner* — Rakesh B Patel
(74) *Attorney, Agent, or Firm* — Foley & Lardner LLP

(57) ABSTRACT

A circuit board has a glass core in which a through hole is formed, and a conductor pattern is formed on an inner peripheral wall of the through hole and a surface of the glass core to form a circuit element including a solenoid coil element and a capacitor element. Accordingly, a low-cost and compact circuit board capable of supporting high-capacity communication for thin mobile communication devices such as smartphones can be provided. Since the circuit board can be electrically connected to at least one of the electronic components such as a switch, an amplifier, and a filter via one terminal, and can be electrically connected to a mother board via another terminal, it has integrated functions, and can be suitably used for thin mobile communication devices such as smartphones.

17 Claims, 30 Drawing Sheets

(51) Int. Cl.
*H03H 7/46* (2006.01)
*H05K 3/46* (2006.01)

(58) Field of Classification Search
USPC .................................................. 333/175, 185
See application file for complete search history.

(56) References Cited

U.S. PATENT DOCUMENTS

| | | | |
|---|---|---|---|
| 2008/0180192 A1* | 7/2008 | Sakisaka | H03H 7/1766 |
| | | | 333/185 |
| 2014/0354378 A1 | 12/2014 | Zuo et al. | |
| 2015/0304059 A1 | 10/2015 | Zuo et al. | |
| 2017/0187345 A1 | 6/2017 | Yun et al. | |
| 2017/0290143 A1* | 10/2017 | Ito | H01L 23/5383 |

FOREIGN PATENT DOCUMENTS

| | | |
|---|---|---|
| JP | 2016-096262 A | 5/2016 |
| JP | 2016-527743 A | 9/2016 |
| WO | WO-2009/028596 A1 | 3/2009 |
| WO | WO-2017/116616 A1 | 7/2017 |

OTHER PUBLICATIONS

International Searching Authority, "International Search Report," issued in connection with International Patent Application No. PCT/JP2019/020449, dated Aug. 6, 2019.

International Searching Authority, "Written Opinion," issued in connection with International Patent Application No. PCT/JP2019/020449, dated Aug. 6, 2019.

\* cited by examiner

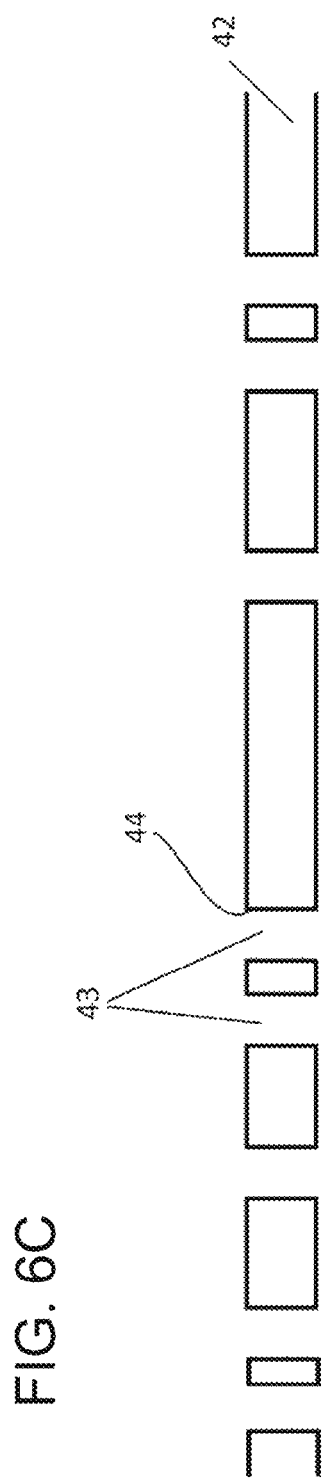

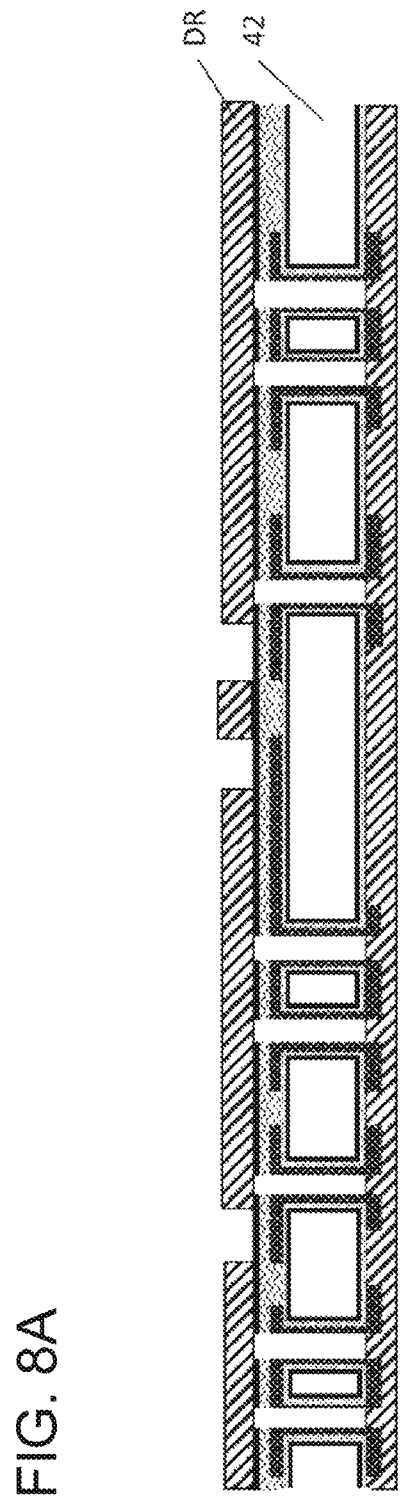

CIRCUIT BOARD

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2019/020449, filed on May 23, 2019, which is based upon and claims the benefit of priority to Japanese Patent Application No. 2018-099705, filed on May 24, 2018, the disclosures of which are all incorporated herein by reference in their entireties.

TECHNICAL FIELD

The present invention relates to circuit boards.

BACKGROUND

Despite the shipment of smartphones having been flat in recent years, the communication data volume is increasing due to the expansion of video distribution services. This trend is expected to continue in the future. In order to address the increase in communication traffic volume, new high-speed cellular communication technologies such as High Band (2.3 to 6.0 GHz), TDD (Time Division Duplex), CA (Carrier Aggregation), and MIMO (Multi Input Multi Output) have been commonly used, increasing the number of RF (Radio Frequency) filters used in one smartphone.

Cellular communication uses duplex transmission/reception, which includes TDD and FDD (Frequency Division Duplex). TDD is a duplexing technique in which one communication band is divided into time slots, and FDD is a duplexing technique using a set of adjacent communication bands (a transmission band is referred to as UL (Up Link), and a reception band is referred to as DL (Down Link)).

While FDD uses symmetric duplex in radio wave transmission and reception, TDD enables asymmetric duplex and has a theoretical advantage in radio usage efficiency over FDD. Further, since TDD is implemented by using one wavelength band, a circuit configuration is simpler than that in FDD that uses two wavelength bands.

Although TDD has a theoretical advantage as described above, the accuracy in synchronization between the terminal and the base station was low and a long blank period was necessary between transmission and reception at the beginning of digital cellular communication. For this reason, FDD was more extensively used due to the advantages in radio usage efficiency. In such a situation, recent developments in technologies for synchronization between the terminal and the base station contribute to shortening of the blank period in TDD and accelerate more extensive use of TDD. Advances in synchronization technology lead to high-speed broad band communication. While the FDD bandwidth was 20 MHz or lower in the beginning, the current TDD bandwidth is around 200 MHz broadband.

In current cellular communication, the 460 MHz to 6 GHz frequency band is allocated to communication bands.

Since radio waves at lower frequencies have good transmission characteristics (such as attenuation and obstacle avoidance), the 1 GHz band or lower was commonly used initially. However, with an increase in communication traffic volume, the usage of 1 GHz bands or lower quickly became overcrowded, and currently the 2 GHz band has also become overcrowded.

In this situation, broadband TDD in the 2.3 to 6.0 GHz band, which still has unused bands, is expected to be more extensively used in the future.

Specifications of communication bands used by each carrier in each country are specified by 3GPP (Third Generation Partnership Project), and each communication band is represented by a band number.

Band 12 is a communication frequency range specified for FDD, with UL of 699 to 716 MHz, and DL of 729 to 746 MHz, and uses narrow bands of 17 MHz with a gap of 13 MHz. The communication band is isolated from external radio waves, which cause noise, by a bandpass filter (hereinafter, referred to as a BPF, or also called a frequency filter). The frequency filter for isolating narrow adjacent bands such as those used in Band 12 may be an AW (Acoustic Wave) filter having sharp bandpass characteristics.

An AW filter includes SAW (Surface Acoustic Wave) filters and BAW (Bulk Acoustic Wave) filters. A SAW filter is a filter having comb-shaped facing electrodes on the piezoelectric body, and configured to use resonance of surface acoustic waves. A BAW filter includes a FBAR-type (film bulk acoustic resonator) and an SMR-type (solid mounted resonator). An FBAR is a filter having a cavity under a piezoelectric film so as to use the resonance of bulk acoustic waves. An SMR is a filter having an acoustic multilayer film (mirror layer) under the piezoelectric film, instead of having a cavity, so as to use resonance due to reflection of acoustic waves. FBARs are superior to the SMRs in steepness of filter characteristics and allowable insertion power, and are the mainstream of current BAWs. FBARs seem to be more expensive than SAWs due to the cavity being manufactured with advanced MEMS technology.

BAW filters are superior to SAW filters in high-frequency characteristics such as allowable insertion power, and these filters are used in different applications according to the following usage frequencies.

Low Band (1.0 GHz or lower): SAW filter
Middle Band (1.0 to 2.3 GHz): SAW filter or BAW filter
High Band (2.3 GHz or higher): BAW filter High-end smartphones that can be internationally used have an RF (Radio Frequency) circuit for switching multiple communication bands (10 to 20) for the respective regions and carriers with one model. For this reason, these high-end smartphones are likely to cause signal interference attributed to complicated circuit board wiring. In order to avoid this problem, the high-end smartphones have a module in which a frequency filter, an amplifier, and a high-speed switch are integrated for each frequency band and communication system so as to perform optimization of the circuit.

Further, in smartphones, since the circuit board and the display element need to be stacked and mounted in an approximately 6 mm-thick casing, the thickness of the module must be within a range of approximately 0.6 to 0.9 mm.

As well as the AW filter, an LC filter in which a reactance due to a solenoid coil and a capacitance are combined can also be used as a frequency filter. Although the LC filter, having threshold characteristics broader than those of the AW filter, is difficult to use in FDD in which adjacent bands are simultaneously used, the LC filter can be used as a frequency filter in TDD that employs one continuous band.

Further, the LC filter is superior to the AW filter in allowable insertion power, wide communication band (broad band), temperature drift, and the like that are required for a frequency filter for High Band (3.5 to 6.0 GHz) TDD, which is expected to become more common in the future.

However, a chip LC filter manufactured by a conventional LTCC (Low Temperature Co-fired Ceramics) technique has a larger size compared to an AW filter. For this reason, it is difficult to install the LC filter in a thin module of a high-end smartphone, especially due to this thickness.

High-speed communication technology that will become widely available in the future includes CA (Carrier Aggregation). CA is a technique for implementing high-speed communication by using a plurality of communication bands simultaneously.

Accordingly, the frequency filter for CA is required to isolate each communication band from other communication bands that are simultaneously used. That is, the noise intensity required to be suppressed is much higher than that of conventional external radio waves. Therefore, circuit optimization by employing an integrated module in CA unit is important.

A plurality of communication bands that are simultaneously used in CA include 2.3 to 6.0 GHz TDD bands. Therefore, in order to support future high-speed communication technology, how an LC filter is mounted in a thin module of the smartphone is a matter of consideration. In order to address this issue, PTL 1 discloses a technique of incorporating a coil in a circuit board to provide a compact circuit configuration.

CITATION LIST

[Patent Literature] PTL 1: JP 2005-268447 A; PTL 2: U.S. Pat. No. 9,401,353 B; PTL 3: U.S. Pat. No. 9,425,761 B.

SUMMARY OF THE INVENTION

Technical Problem

PTL 1 discloses a multilayer circuit board with a built-in coil in which a coil pattern, which constitutes a part of a coil, is formed in at least two or more layers among the wiring pattern layers. A through hole is formed to extend between respective ends of the coil patterns at a predetermined position in an insulating substrate, which is sandwiched between the respective coil patterns, and the through hole is filled with a conductive paste so that the respective ends of the coil patterns are electrically connected therethrough.

The above insulating substrate is formed of a glass epoxy substrate or the like, and the through hole is formed by machining by using a drill or the like. Since the end of the glass fiber is exposed to the inner peripheral wall of the through hole, the inner peripheral wall has a rough surface. In addition, the glass epoxy substrate inherently has a rough surface having irregularities. Therefore, even when the coil pattern is formed as described above, the width and diameter of the wire locally vary, which causes deterioration and variation in electrical characteristics of the coil.

Alternatively, a coil may be incorporated in a silicon substrate. For example, PTL 2 discloses a silicon interposer having built-in passive components such as a trench capacitor, a diode, and a power tap. Since silicon is a semiconductor and requires formation of an insulating film for conductor wiring, it has a problem in the cost and performance in the LC filter application.

Further, PTL 3 discloses an LC frequency filter composed of a reactance of a 3D structure formed by providing a penetrating conductor in the glass substrate and a capacitance formed on a surface of the glass substrate. However, the LC frequency filter of PTL 3 does not have an interposer function.

An integrated module of the RF circuit has a frequency filter, an amplifier, and a high-speed switch mounted on a resin substrate constituting an interposer. In the thin mobile communication devices according to the conventional communication standard, the frequency filter is required to have a center frequency of 0.8 to 3.5 GHz, a passband of 30 to 120 MHz, and immediate suppression. Accordingly, filters using physical resonance, such as Surface Acoustic Wave (SAW) and Bulk Acoustic Wave (BAW) types have been used. On the other hand, LC filters, which use electrical resonance, find it difficult to perform such immediate suppression, and so far have not been used.

The 5G communication standard requires wider bandwidth such as center frequency 3.7 GHz: passband 600 MHz, center frequency 4.5 GHz: passband 500 MHz, and the like, and the requirements of immediate suppression are lowered. In addition, an increase in insertion loss (heat generation) due to higher frequencies is a consideration in 5G communication.

In an AW filter, elements are required to be connected in parallel in order to achieve a wide passband, leading to an increase in the number of parts. Further, since the AW filter uses physical resonance, insertion loss becomes more serious with higher frequencies. On the other hand, in an LC filter that uses electrical resonance, a wide passband can be achieved with a single element. Since the LC filter uses electrical resonance, insertion loss in higher frequencies is small.

However, a Low Temperature Co-fired Ceramics (LTCC) filter, which is a typical small LC filter, is difficult to downsize. Accordingly, it is difficult to mount the filter on an interposer substrate for a thin module.

The present invention has been made in view of these issues, and is directed to provide a low-cost and compact circuit board capable of supporting high-capacity communication for thin next-generation mobile communication devices.

Solution to Problem

In order to address the above issue, a circuit board according to the present invention includes: a glass plate having a through hole; and a plurality of circuit elements, wherein a circuit made of a conductive member disposed on an inner peripheral wall of the through hole and a surface of the glass plate is provided, a laminated circuit having an insulating member made of a resin is provided on at least a first surface of the glass plate, the laminated circuit being electrically connected to the circuit on the surface of the glass plate, a first circuit element is a solenoid coil element disposed in a coil shape on the inner peripheral wall of the through hole and the surface of the glass plate, a second circuit element is a capacitor element including a lower electrode formed of the circuit disposed on the surface of the glass plate or a lower electrode formed of the laminate circuit, a dielectric layer formed on the lower electrode, and an upper electrode formed on the dielectric layer, the solenoid coil element and the capacitor element constitute at least one LC frequency filter, a first terminal is formed on a first surface of the circuit board, and a second terminal is formed on a second surface of the circuit board, and the circuit or the laminated circuit on the first surface of the glass plate is configured to be electrically connected to at least one electronic component via the first terminal, and the circuit or the laminated circuit on a second surface of the glass plate is configured to be electrically connected to another circuit board via the second terminal.

Advantageous Effects of Invention

According to the present invention, a low-cost and compact circuit board capable of supporting high-capacity communication for thin next-generation mobile communication devices can be provided.

BRIEF DESCRIPTION OF THE DRAWINGS

FIG. 6C is a view illustrating a manufacturing process of a circuit board according to an embodiment of the present invention.

FIG. 8A is a view illustrating a manufacturing process of a circuit board according to an embodiment of the present invention.

DETAILED DESCRIPTION

Figure 1A:
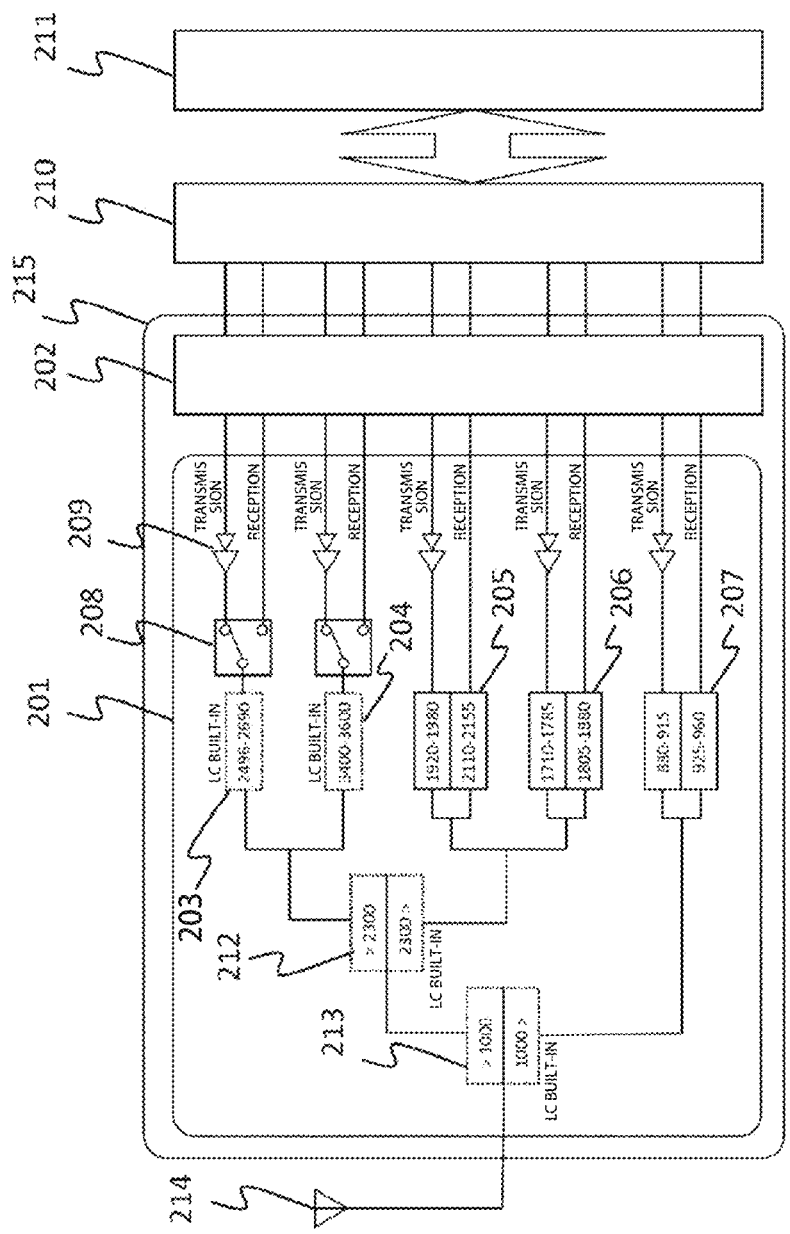
FIG. 1A is a block diagram of a circuit board having built-in circuit elements according to the present invention.

Embodiments of the present invention of will be described below with reference to the drawings. In the following description of the drawings to be referred, components or functions identical with or similar to each other are given the same or similar reference signs, unless there is a reason not to. It should be noted that the drawings are only schematically illustrated, and thus the relationship between thickness and two-dimensional size of the components, and the thickness ratio between the layers, are not to scale. Therefore, specific thicknesses and dimensions should be understood in view of the following description. As a matter of course, dimensional relationships or ratios may be different between the drawings.

Further, the embodiments described below are merely examples of configurations for embodying the technical idea of the present invention. The technical idea of the present invention does not limit the materials, shapes, structures, arrangements, and the like of the components to those described below. The technical idea of the present invention can be modified variously within the technical scope defined by the claims. The present invention is not limited to the following embodiments within the scope not departing from the spirit of the present invention.

Embodiments

In the specification, the term "upper" refers to a position farther from a glass plate, and the term "lower" refers to a position closer to a glass plate. Further, the term "circuit elements" refers to passive elements such as resistors, capacitors, and inductors, and preferably refers to components of an LC circuit. Such circuit elements are preferably components of an LC filter that constitutes a bandpass filter used in TDD at frequency bands of 2 GHz or higher in multi-band communication. Such an LC filter may be a demultiplexing filter such as a low-pass filter, a high-pass filter, or a diplexer, or may be a notch filter that removes noise in a specific band.

The "LC filter" is also called an LC frequency filter, which refers to a circuit in which an inductor (L) and a capacitor (C) are combined to cut off or pass a specific frequency band, and has a function of a bandpass filter, a low-pass filter, a high-pass filter, or a diplexer. In particular, the LC frequency filter used in the present embodiment is preferably used for time division duplex transmission/reception communication in a frequency band at 2 GHz or higher in mobile communication, and also preferably a bandpass filter having a passband of 50 MHz or greater.

First, with reference to FIG. 1A, the overall structure and function of the transmission/reception circuit using a circuit board according to the present embodiment will be described. The transmission/reception circuit shown in FIG. 1A can be suitably used for next-generation smartphones. Next-generation smartphones use a cellular RF circuit which supports CA technology that enables high-speed communication by simultaneous multi-band communication, and include a circuit board having a bandpass filter used as a frequency filter for respective communication bands, a switch, an amplifier, and, if necessary, RF components such as a demultiplexing filter such as a high-pass filter, a low-pass filter, or a diplexer, which are integrated thereon.

In radio reception, an RF circuit 215 controlled by a transceiver LSI 202 extracts a communication signal from the radio wave received by the antenna 214. A baseband processor 210 extracts a baseband signal from the communication wave to reconstruct a packet. An application processor 211 configures a service required by the user from the received packet. On the other hand, a reverse path applies to radio transmission.

The operation of the RF circuit 215 in CA technique will now be described in detail.

The radio waves received by the antenna 214 are demultiplexed by the diplexer 213 into a Low Band lower than 1000 MHz and a higher band higher than 1000 MHz. The higher band is further demultiplexed by the diplexer 212 into a Middle Band lower than 2300 MHz and High Band higher than 2300 MHz. The Low Band includes band 8 FDD, the Middle Band includes band 1 FDD and band 3 FDD, and the High Band includes band 41 TDD and band 42 TDD. As described above, separating frequency bands by using a demultiplexing filter before extracting a communication signal for each band by using a frequency filter is effective for suppressing interference between the bands in the CA technique that uses multiple bands simultaneously.

When different frequency filters (203 and 204, 205 and 206) exist on the same circuit without separation being performed by a demultiplexing filter, an adjustment LC element can be effectively added to each filter that requires interference suppression. The adjustment LC element can also be effectively used as necessary when disposed between filters separated by a demultiplexing filter. Such an interference suppression LC element, which is incorporated in a module circuit board, is effective to provide a highly functional and compact circuit board.

Pairs of bandpass filters 205 and 206, which are used for transmission and reception in FDD, are called duplexers. In TDD, a switch 208 is respectively used for the bandpass filters 203 and 204 so that transmission and reception are separated in time. Both in FDD and TDD, the communication wave is amplified by an amplifier 209 before passing through the frequency filter.

One CA unit module includes 2 diplexers, 2 bandpass filters, 2 switches, 3 duplexers, and 5 amplifiers. According to the present embodiment, since 2 diplexers and 2 bandpass filters are provided as LC filters in the module circuit board, solenoid coil elements of the LC filters, which are partially formed in the circuit board, can be downsized. RF components other than the LC filters can be mounted on the module circuit board to thereby reduce the module area. Accordingly, highly functional and compact circuit board can be achieved.

The RF circuit 215 in FIG. 1A includes one CA unit module 201. However, when a smartphone supports a plurality of communication carriers, a plurality of CA unit modules can be mounted for different CAs.

Figure 1B:
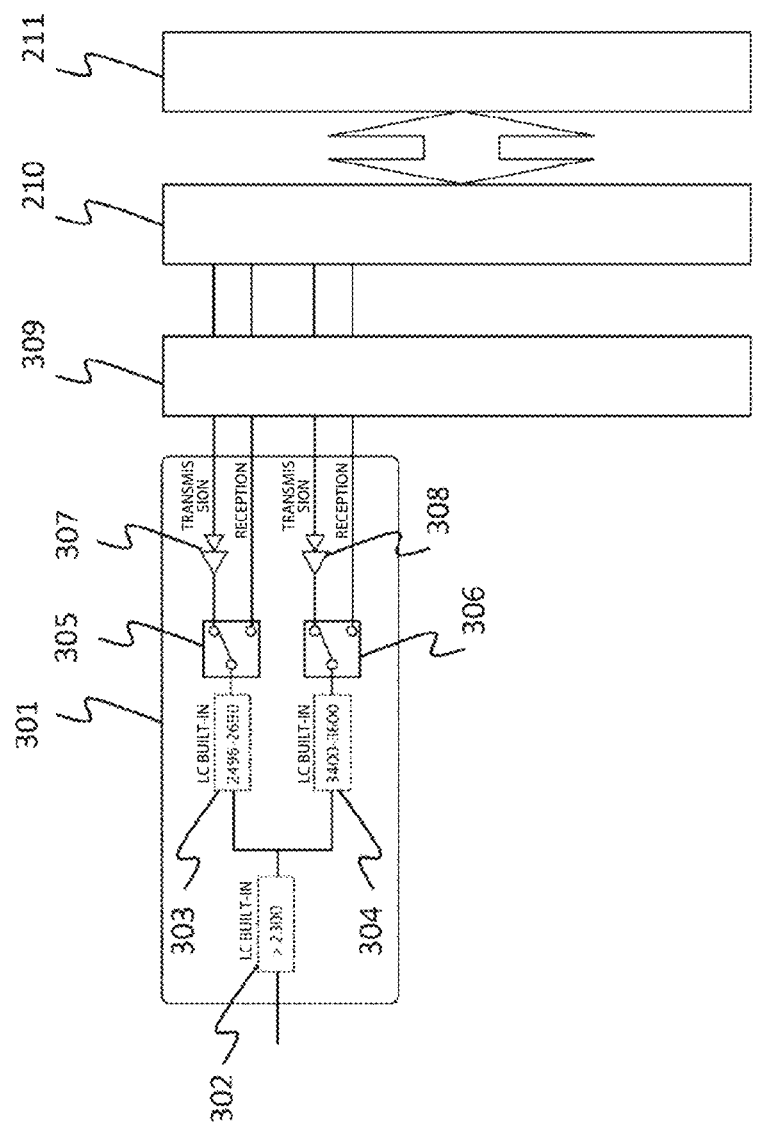
FIG. 1B is a block diagram of a circuit board having built-in circuit elements according to the present invention.

In the present embodiment, as shown in FIG. 1B, frequency filters, amplifiers, and switches can be combined for each band or communication system as a conventional module, which can be used as a High Band TDD module. In FIG. 1B, the high-pass filter 302, the TDD bandpass filters 303 and 304 can be provided as LC filters in the module circuit board. In FIG. 1B, common components are denoted by the same reference signs, and duplicated description thereof will be omitted.

The circuit elements according to the present embodiment are preferably components of an LC filter that constitutes a bandpass filter used in TDD. Further, the circuit elements according to the present embodiment are preferably components of an LC filter that constitutes a demultiplexing filter such as a diplexer, a high-pass filter, and a low-pass filter. Further, the circuit elements according to the present embodiment are preferably solenoid coil elements for an adjustment circuit for suppressing interference between the bandpass filters.

Next, an example of a capacitor and an inductor as circuit elements of an LC circuit will be described by using an example of a substrate in which a wiring layer and an insulating resin layer are alternately formed on both surfaces of a core material made of a glass plate.

Figure 2:
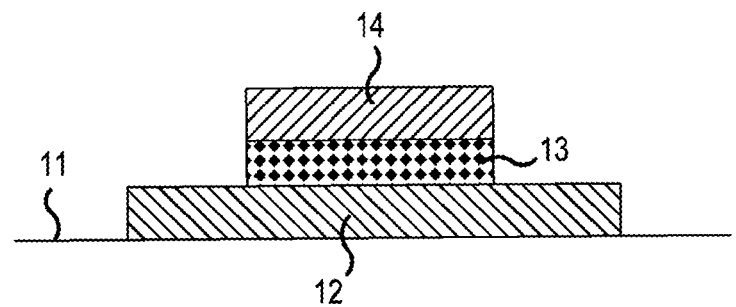
FIG. 2 is a cross-sectional view of a capacitor in an embodiment of the present invention.

The capacitor has a structure in which a dielectric is sandwiched between two conductor plates. An example of the capacitor is shown in FIG. 2, in which an insulating resin layer 11 formed directly above or on a glass substrate (not shown) is laminated with a lower electrode 12 to form a conductor pattern. The conductor pattern is further laminated with a dielectric layer 13 and an upper electrode 14 made of a conductor in this order. The lower electrode 12 and the upper electrode 14 typically have a multi-layer structure having a seed layer and a conductive layer.

Figure 3:
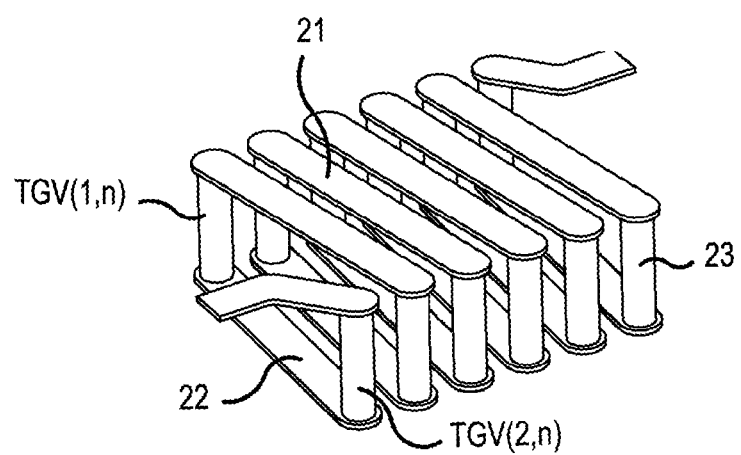
FIG. 3 is a cross-sectional view of an inductor in an embodiment of the present invention.

As for the inductor, a glass substrate having through holes can be provided with the same performance as that of a spiral coil. In FIG. 3, a parallel flat glass plate having through holes arranged in two rows is shown transparent. As shown in FIG. 3, wiring 21 and 22 are disposed on the front and rear surfaces of the glass plate so as to connect the openings of the adjacent through holes, while forming a conductor layer, which is referred to as a TGV, on an inner wall of a through hole 23 that penetrates the glass plate between the front and rear surfaces.

Hereinafter, the nth conductor layer TGV in the first column is referred to as TGV (1, n), and the nth conductor layer TGV in the second column is referred to as TGV (2, n). The conductor layer TGV (1, n) and the conductor layer TGV (2, n) are connected by the wiring 22 on the rear surface, whereas the conductor layer TGV (1, n) and the conductor layer TGV (2, n+1) are connected by the wiring 21 on the front surface. Thus, the wiring 22, the conductor layer TGV (1, n), the wiring 21, and the conductor layer TGV (1, n+1) form an open circuit of the conductor having one turn around the outer and inner surfaces of the glass plate. When supplied with a current, the coil-shaped circuit functions as an inductor. The characteristics of the inductor can be adjusted by changing the number of turns.

Figure 4A:
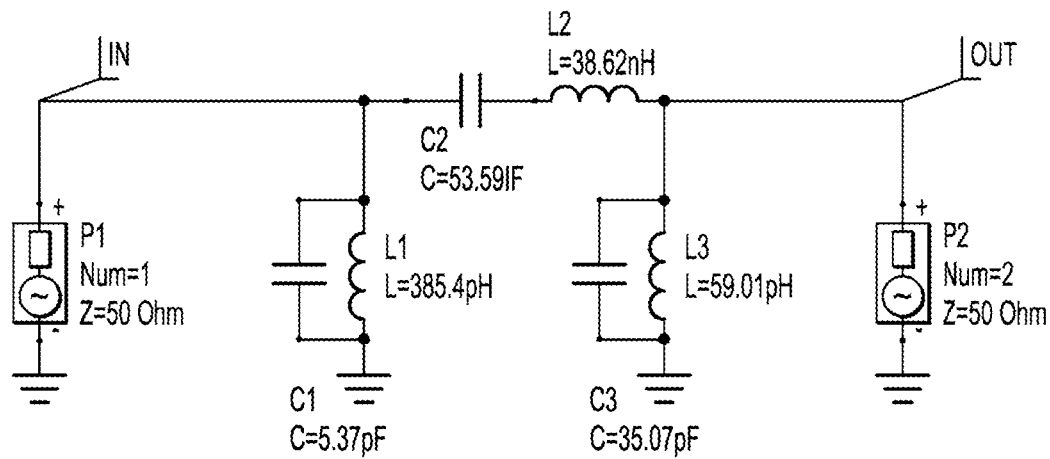
FIG. 4A is a circuit diagram of a bandpass filter in an embodiment of the present invention.

Next, the description will be given of a bandpass filter (BPF) including an LC circuit formed inside the substrate, that is, an LC frequency filter. FIG. 4A is a basic circuit diagram of the BPF. The electrical capacitance (hereinafter, capacitance) of a capacitor and the induction coefficient (hereinafter, inductance) of an inductor in the circuit can be appropriately set to achieve a bandpass effect that passes frequencies in a desired range and blocks others.

Figure 4B:
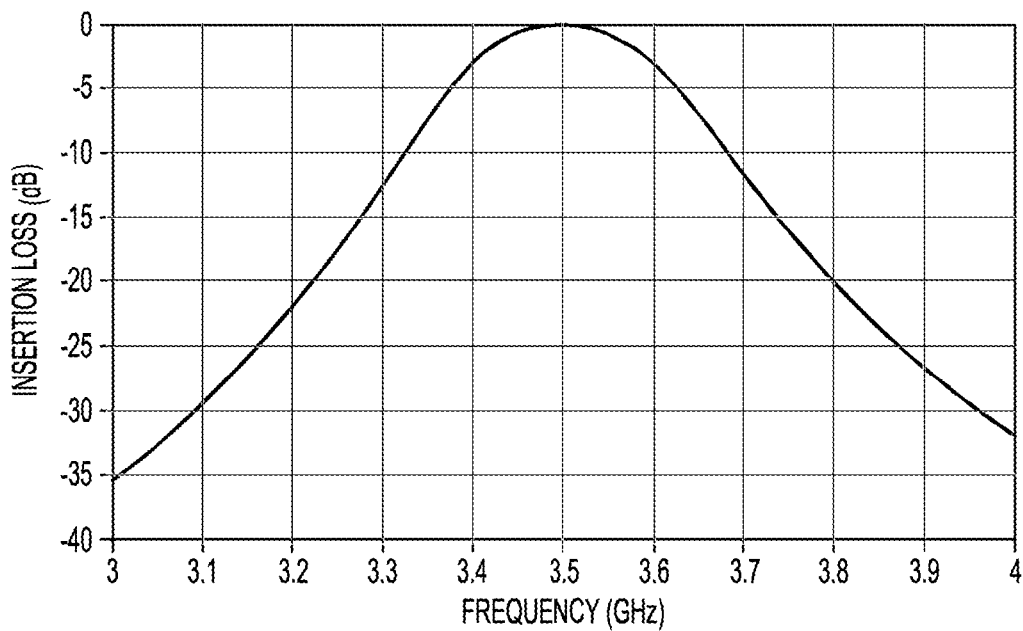
FIG. 4B is a diagram of an example of frequency characteristics of a bandpass filter.

FIG. 4B is a diagram showing characteristics of the bandpass filter of FIG. 4A. In FIG. 4B, the horizontal axis represents frequency, and the vertical axis represents insertion loss. As seen from FIG. 4B, suppression is not sharp in this bandpass filter.

Figure 5A:
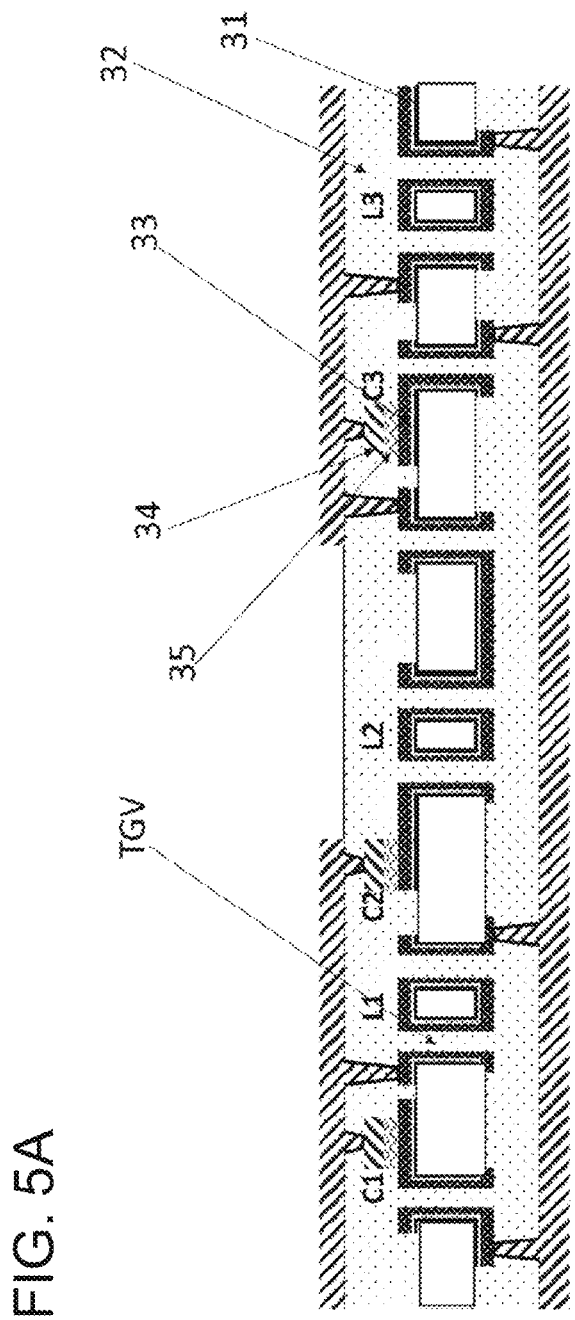
FIG. 5A is a cross-sectional view of a circuit board having a bandpass filter in an embodiment of the present invention.

FIG. 5A is a schematic diagram illustrating that the capacitors and the inductors shown in the circuit diagram of FIG. 4A are formed in the circuit board. In the figure, C1 to C3 are capacitors, and L1 to L3 are inductors. The capacitors C1 to C3 are formed of a lower electrode 33 disposed as a conductive member on the upper surface of a glass core 31 and an upper electrode 34 disposed with a dielectric layer 35 therebetween. The capacitors C1 to C3 are generally embedded in an insulating resin layer 32 disposed on the upper surface of the glass core 31, and are configured to be electrically connected to an electrode outside the circuit board via a conductor inside a via hole formed in the insulating resin layer 32. The lower electrode 33 may be a conductive portion of a laminated circuit (not shown) that is formed on one surface of the glass core 31 and insulated by a resin layer.

The inductors L1 to L3 can form a solenoid coil by connecting the conductor layer TGV inside the glass core 31 and the wirings (see FIG. 5A) disposed on the front and rear surfaces of the glass core 31. The main bodies of the inductors L1 to L3 are embedded in the glass core 31 and the insulating resin layer 32 disposed on the front and rear surfaces of the glass core 31, and can be electrically connected to an electrode on the outermost layer of the circuit board via a via hole formed in the insulating resin layer 32 as with the capacitors C1 to C3.

The capacitor C1 and the inductor L1 are used to form a first LC frequency filter, the capacitor C2 and the inductor L2 are used to form a second LC frequency filter having characteristics different from those of the first LC frequency filter, and the capacitor C3 and the inductor L3 are used to form a third LC frequency filter having characteristics different from those of the first LC frequency filter and the second LC frequency filter. Thus, a plurality of LC frequency filters having different characteristics can be incorporated in one circuit board, which enables optimization of communication in a plurality of frequency bands in one module, for example, when used for a thin mobile communication device that supports the 5G communication standard.

In the 5G communication standard, Carrier Aggregation (CA), which is a technique for high-speed data communication using a plurality of bands simultaneously has become widespread. In this technique, for example, three frequency bands of 900 MHz, 2.5 GHz, and 3.7 GHz are simultaneously used to perform high-speed communication. While conventional frequency filters have a role of suppressing interference in communication bands due to external noise, CA requires suppression of interference between its own communication bands, and noise suppression is more importance. In order to address this issue, it is necessary to configure an integrated module in a CA unit to thereby optimize the circuit and suppress external noise. According to the present embodiment, since the LC filters are configured in a module, functions can be integrated while reducing the mounted area.

Figure 5B:
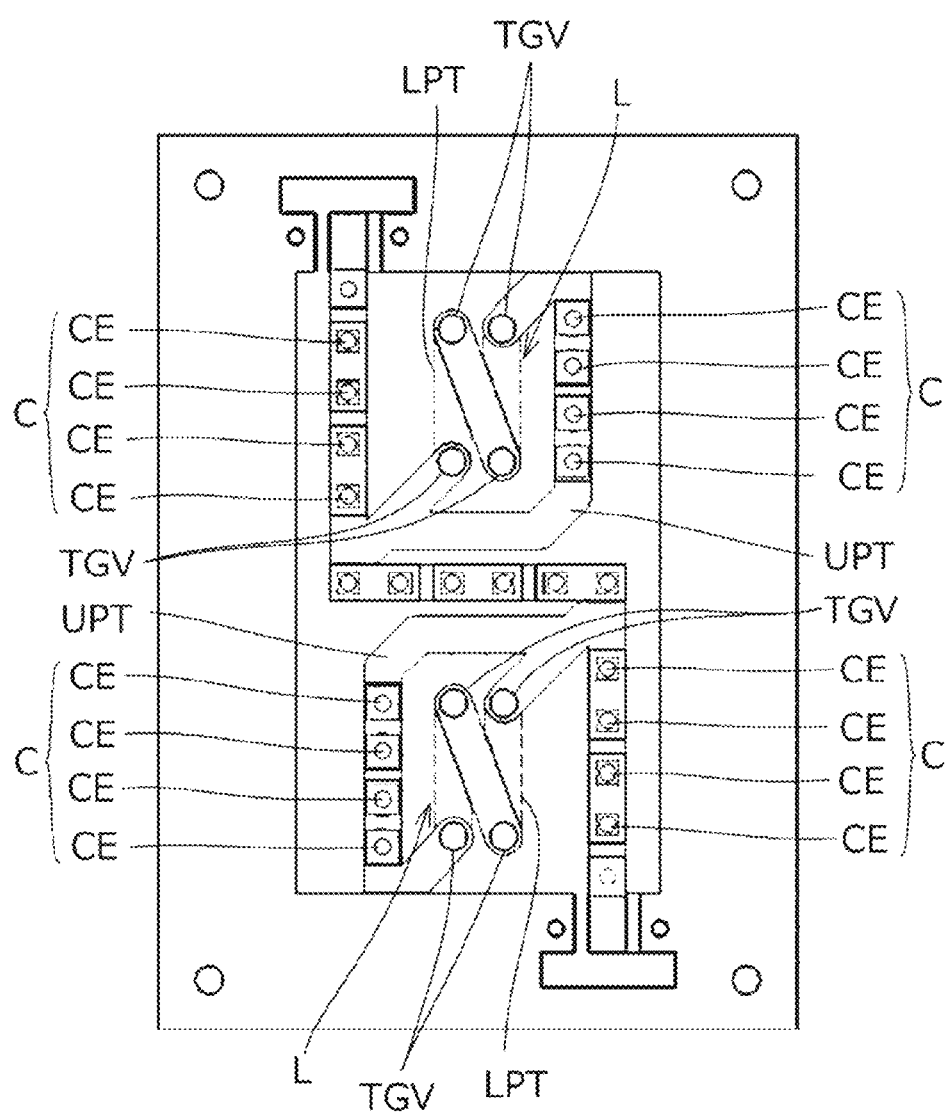
FIG. 5B is a top view of a circuit board having an LC frequency filter.

FIG. 5B is a partial top view of a circuit board, in which each capacitor C is formed by connecting a plurality of low-capacitance capacitor elements CE along a conductive pattern UPT formed on top of the capacitor elements CE. Further, the coil-shaped inductor L is formed by connecting the conductive pattern UPT to a conductive pattern LPT (indicated by the dotted line) formed on the underside of the circuit board via a conductor layer (conductive member) TGV inside the through hole. Thus, the conductive patterns UPT, LPT and the conductor layer TGV form the circuit.

(Fabrication Process of Circuit Board)

With reference to FIGS. 6A to 12B, an example of fabrication process of a circuit board using a glass substrate will be described.

First, in order to design a circuit, required capacitance and inductance depending on the frequency bands of the radio waves intended to be passed or blocked are calculated using simulation software. Tables 1 and 2 show the specifications of elements for achieving desired characteristics in the circuit configuration shown in FIG. 4A in the bands of 3400 MHz or higher and 3600 MHz or lower, for example. For the inductors L1 and L3, having insignificantly small inductance, it is not necessary to form a coil shape, and self-inductance of a single wire is sufficient. For this reason, the dimensions of the wire are shown in the table.

TABLE 1

|  | C1 | C2 | C3 |
| --- | --- | --- | --- |
| Capacitance | 5.37 pF | 53.59 fF | 35.07 pF |
| Dielectric | SiN | SiN | SiN |
| Relative dielectric constant | 6.3 | 6.3 | 6.3 |
| Dielectric thickness | 200 nm | 200 nm | 200 nm |
| Side length | 138.7 μm | 13.9 μm | 354.5 μm |

TABLE 2

|  | L1 | L2 | L3 |
| --- | --- | --- | --- |
| Inductance | 385.4 pH | 38.62 nH | 59.01 pH |
| Number of turns |  | 11 |  |
| Coil width |  | 1.6 mm |  |
| Coil length |  | 1.5 mm |  |
| Coil thickness |  | 0.3 mm |  |
| Wire length | 1.33 mm |  | 0.2 mm |
| Wire width | 0.1 mm |  | 0.1 mm |
| Wire thickness | 15 μm |  | 15 μm |

The capacitance and inductance of the BPFs for 2499 MHz or higher and 2690 MHz or lower are also calculated using the same procedure as that described above to design a required circuit (values are omitted).

Figure 6A:
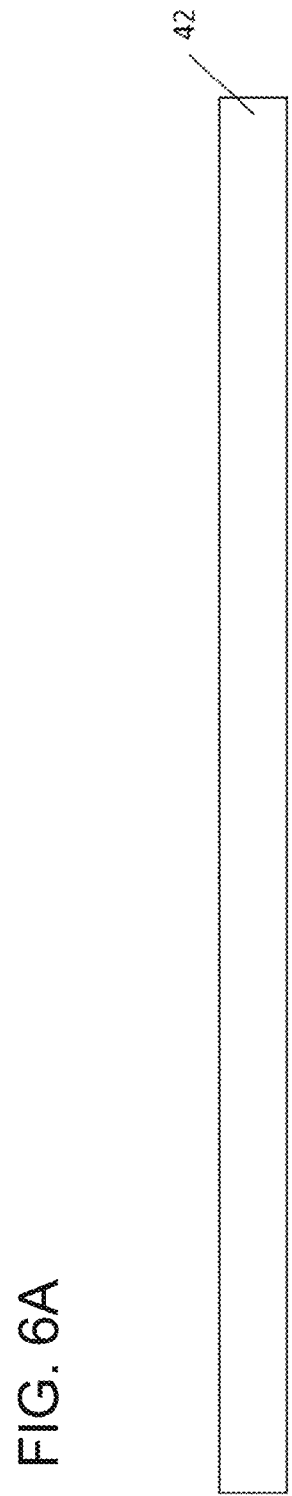
FIG. 6A is a view illustrating a manufacturing process of a circuit board according to an embodiment of the present invention.
Figure 6B:
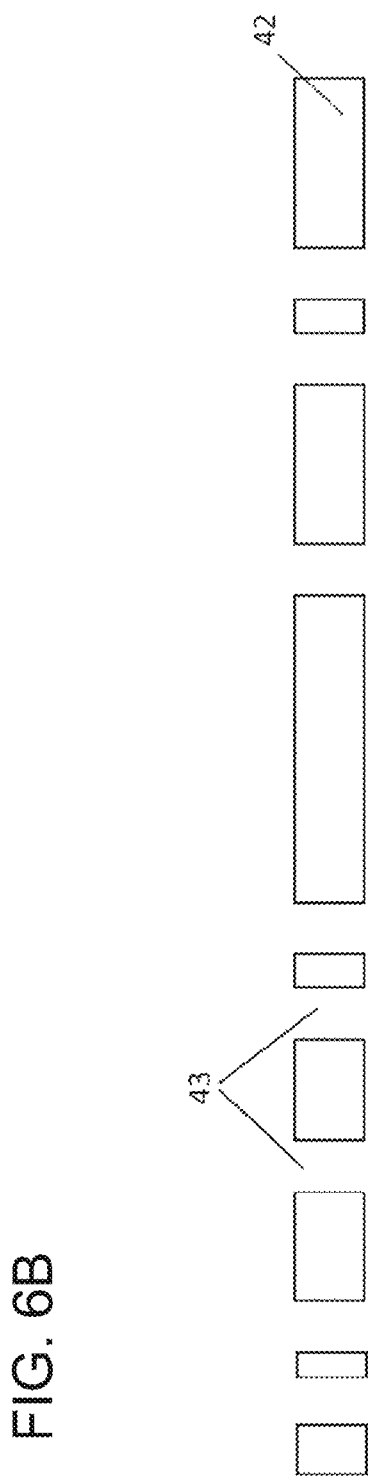
FIG. 6B is a view illustrating a manufacturing process of a circuit board according to an embodiment of the present invention.

A required circuit board is fabricated on the basis of the circuit design described above. First, as shown in FIG. 6A, a low expansion glass core 42 (300 μm thickness, CTE: 3.5 ppm/K) is prepared. Then, as shown in FIG. 6B, a through hole 43 having an opening diameter of 80 μm to 100 μm is formed in the glass core 42. In the first step of formation of the through hole 43, a desired position is pulse-irradiated with a UV laser beam to form a weakened portion in the glass. In the second step, the entire glass plate is etched by using a hydrogen fluoride aqueous solution. Thus, the weakened portion is selectively etched, and a highly accurate through hole 43 is quickly formed. In comparison with a case where a glass epoxy substrate is used, a through hole 43 having a more accurate inner diameter and an inner peripheral surface with a reduced unevenness can be formed.

Next, as shown in FIG. 6C, a Ti film and a Cu film are sputtered in this order as two layers on the entire surface of the glass core 42 to form an adhesion layer 44 under the wiring layer and on the inner wall of the through hole 43 of the glass core 42 so that the glass surface has electrical conductivity. The film thicknesses for the Ti film and the Cu film are set to 50 nm and 300 nm, respectively.

Figure 6D:
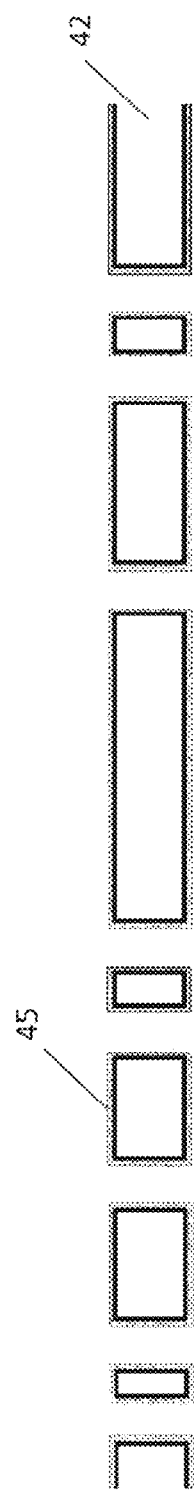
FIG. 6D is a view illustrating a manufacturing process of a circuit board according to an embodiment of the present invention.
Figure 7A:
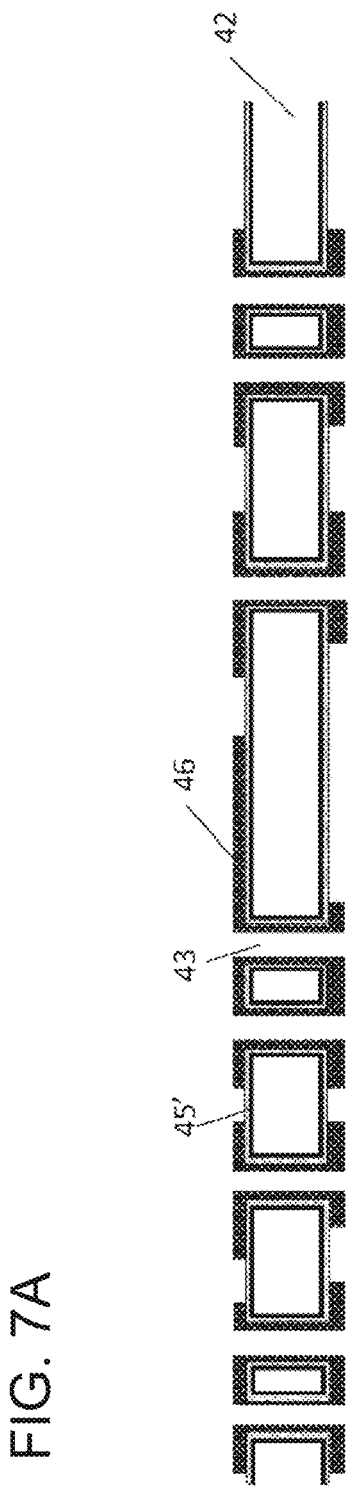
FIG. 7A is a view illustrating a manufacturing process of a circuit board according to an embodiment of the present invention.

Next, as shown in FIG. 6D, an electroless nickel plating 45 is applied to thereby complement thin portions of the sputtered film on the inner wall of the through hole 43. The plating is performed to the entirety of the front and rear surfaces of the glass core 42 and the inner wall of the through hole 43, and the plating thickness is set to 0.2 μm. As shown in FIG. 7A, the adhesion layer 44 and the nickel plating layer 45 form a seed layer 45'.

Next, both surfaces of the glass core 42 are laminated with, for example, a dry film resist manufactured by Hitachi Chemical Co., Ltd., product name RY-3525 (25 μm thickness) to thereby form a conductor pattern 46 of the inductor wirings, the lower electrode of the capacitor, the pads for external connection and the like by semi-additive method using the seed layer 45' (not shown). The resist layer may also be formed by applying a liquid resist. Then, the resist layer is exposed and developed via a mask for forming a conductor pattern, that is, a wiring pattern by photolithography to form a wiring pattern (opening) in the resist layer.

Next, copper is deposited in the opening by electrolytic copper plating to form the conductor pattern 46 of a conductive member with a thickness of 15 μm. In this step, copper plating is also deposited on the inner wall of the through hole 43 of the glass core 42. Subsequently, the dry film resist is removed. In this step, as shown in FIG. 7A, parts of the front and rear surfaces of the glass core 42 are covered with a seed layer 45' made of Ti/Cu/Ni, and parts of the seed layer 45' are laminated with Cu to form a conductor pattern 46. At the step of FIG. 7A, a lower electrode of the capacitor is formed at a predetermined position on the conductor pattern 46. Alternatively, a lower electrode of the capacitor can also be formed by using parts of the conductor pattern 46.

Figure 7B:
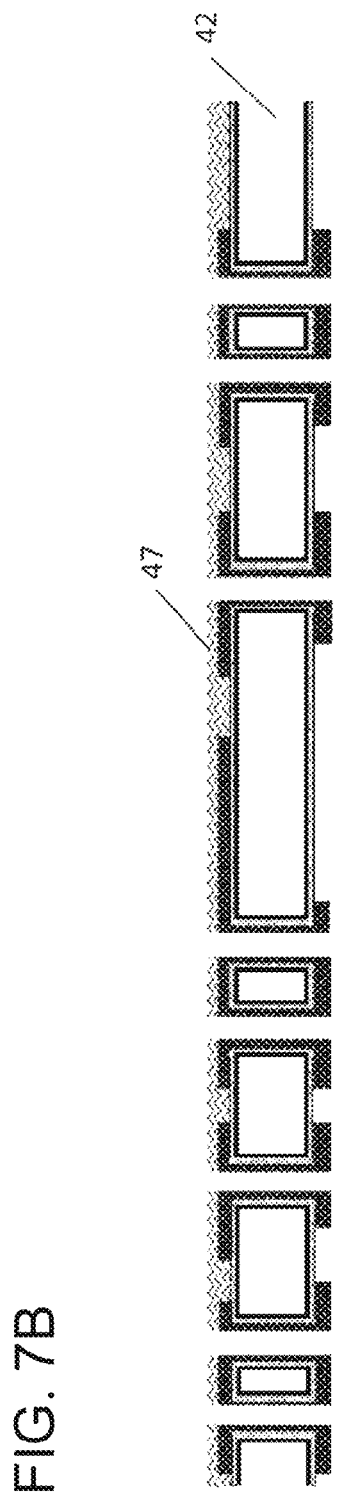
FIG. 7B is a view illustrating a manufacturing process of a circuit board according to an embodiment of the present invention.
Figure 7C:
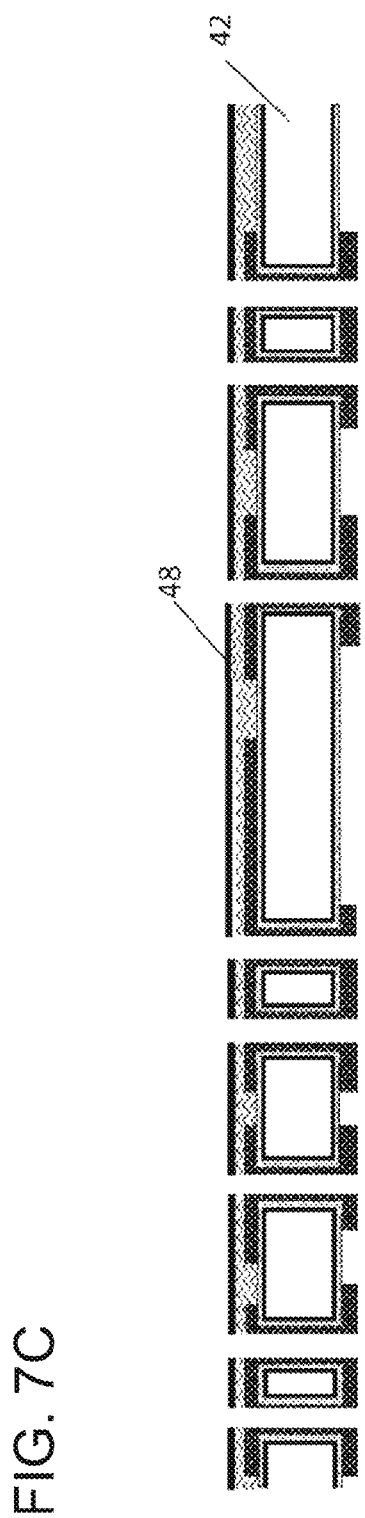
FIG. 7C is a view illustrating a manufacturing process of a circuit board according to an embodiment of the present invention.

Subsequently, as shown in FIG. 7B, a SiN film is first formed on the entire surface of the glass core 42 on a side where the capacitor is formed. The SiN film is formed at a thickness of 200 nm to 400 nm by a CVD film formation method to form a dielectric layer 47 for the capacitor. Further, as shown in FIG. 7C, a Ti film and a Cu film are formed on the entire surface of the dielectric layer 47 by sputtering in this order at a thickness of 50 nm and 300 nm, respectively, to form a seed layer 48 for formation of the upper electrode of the capacitor.

Figure 8B:
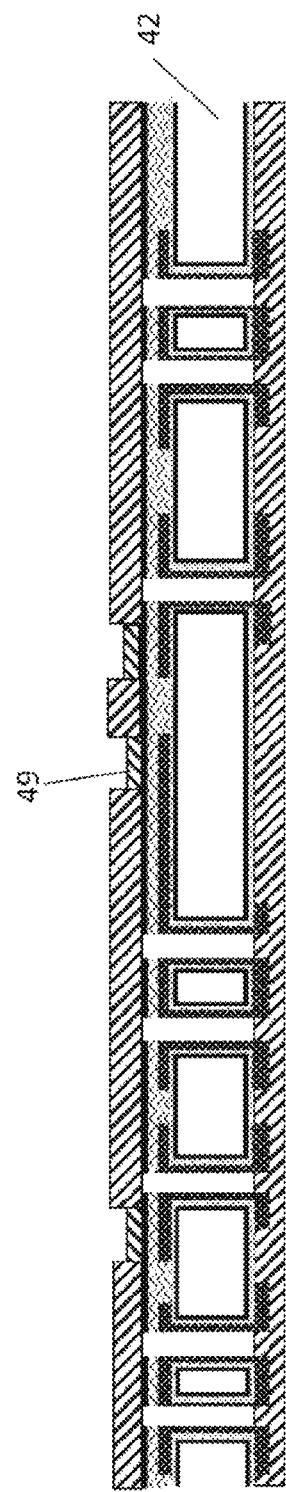
FIG. 8B is a view illustrating a manufacturing process of a circuit board according to an embodiment of the present invention.
Figure 8C:
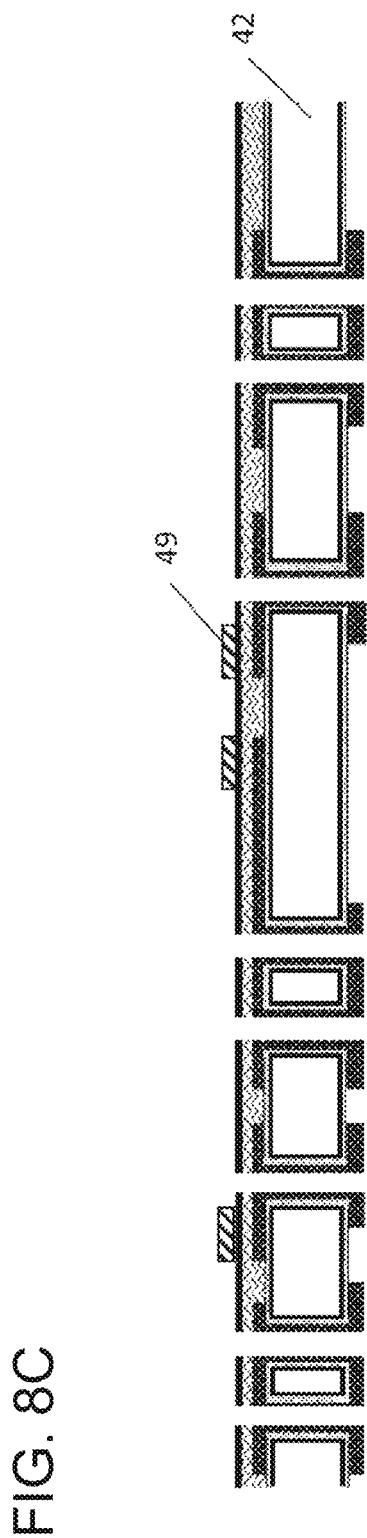
FIG. 8C is a view illustrating a manufacturing process of a circuit board according to an embodiment of the present invention.

Subsequently, as shown in FIG. 8A, only a portion where the upper electrode is to be formed is exposed from the dry film resist by photolithography to thereby form an upper electrode of the capacitor. Then, as shown in FIG. 8B, electrolytic copper plating is applied to form an upper electrode 49 having a thickness of 9 to 10 μm. After that, as shown in FIG. 8C, the dry film resist is removed. Here, a SiN layer and the like are laminated in addition to the capacitor.

Figure 9A:
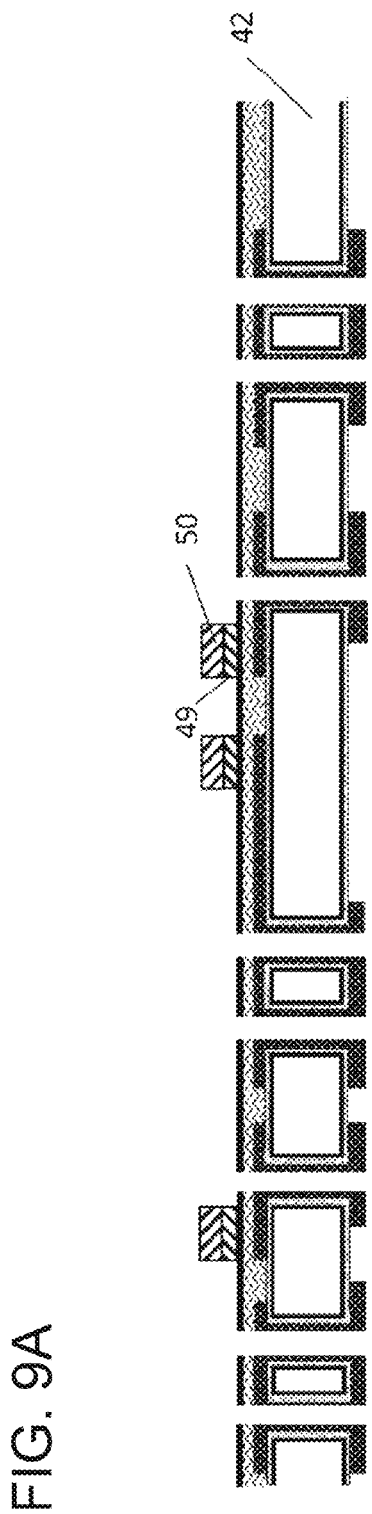
FIG. 9A is a view illustrating a manufacturing process of a circuit board according to an embodiment of the present invention.

As shown in FIG. 9A, only the upper electrode 49 of the capacitor is first protected by a dry film resist 50 by photolithography in order to remove an excess adhesion layer, a plating seed layer, and the like.

Then, the substrate is processed by wet etching to remove excess portions of the sputtered copper layer in film formation of the upper electrode 49 of the capacitor, and the substrate is processed by dry etching to remove a Ti layer and a SiN layer in the excess portion.

Figure 9B:
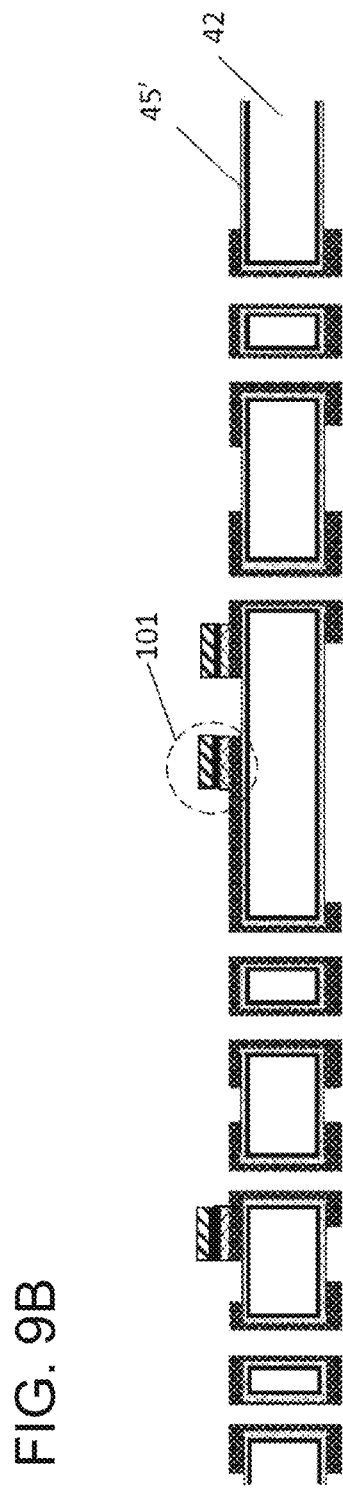
FIG. 9B is a view illustrating a manufacturing process of a circuit board according to an embodiment of the present invention.

More specifically, the uppermost sputtered Cu layer of the excess portion is removed with an etching solution. Then, the underlying sputtered Ti layer and the SiN layer formed by CVD are removed by dry etching. Subsequently, the dry film resist 50 protecting the upper electrode 49 of the capacitor is peeled and removed. As shown in FIG. 9B, the seed layer 45' directly above the glass core 42 is still left.

Figure 10A:
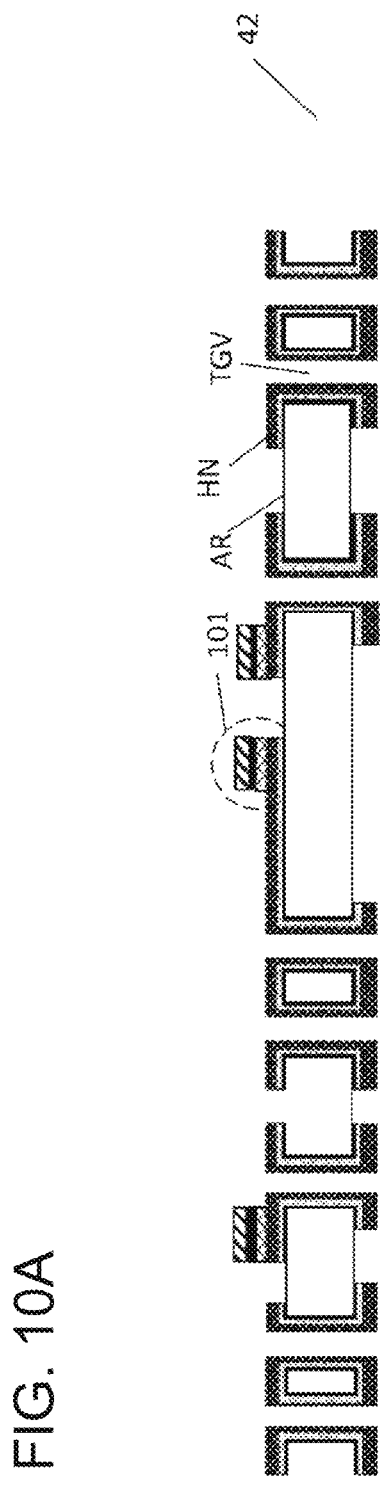
FIG. 10A is a view illustrating a manufacturing process of a circuit board according to an embodiment of the present invention.

Then, as shown in FIG. 10A, in order to remove the seed layer of the conductive layer for the lower electrode of the capacitor and the like formed on the surface of the glass core 42, Ni and Cu are processed in this order by wet etching. The underlying sputtered Cu layer is also simultaneously removed. On the other hand, the Cu layer forming the wiring, capacitor electrode, and the like, which has a relatively large thickness, is not completely removed although dissolved in the etching solution to some extent. Then, the sputtered Ti layer is removed by etching. At this point, the glass core 42 is exposed at positions where the wiring, electrode, the like are not disposed. Thus, a capacitor 101 and a part of a continuous wiring HN that forms an inductor 102 (see FIG. 11B) are formed on the surface of the glass core 42, and connected to the conductor layer TGV. The adhesion layer and the seed layer in a remaining region of the glass core 42, which is referred to as a surface region AR, are removed so that the surface region AR is exposed to the outside.

Figure 10B:
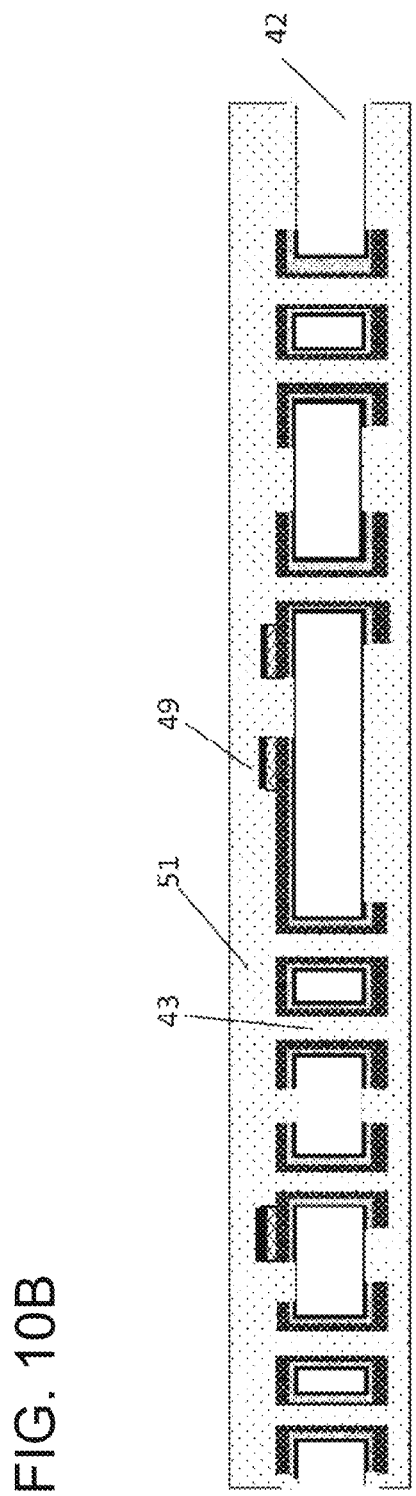
FIG. 10B is a view illustrating a manufacturing process of a circuit board according to an embodiment of the present invention.

Next, as shown in FIG. 10B, an insulating resin, for example, manufactured by Ajinomoto Fine-Techno Co., Inc. (product name "ABF-GX-T31R") is attached to both surfaces of the glass core 42 to form an insulating resin layer (resin built layer) 51. The processing is performed by using a vacuum laminating press machine, and the through hole 43 of the glass core 42 is sealed with an insulating resin without voids. The thickness of the insulating resin layer 51 is set to approximately 35 μm so that the upper electrode 49 of the capacitor is completely embedded therein. Accordingly, the lamination circuit including the capacitor is covered with the insulating resin layer 51.

Figure 10C:
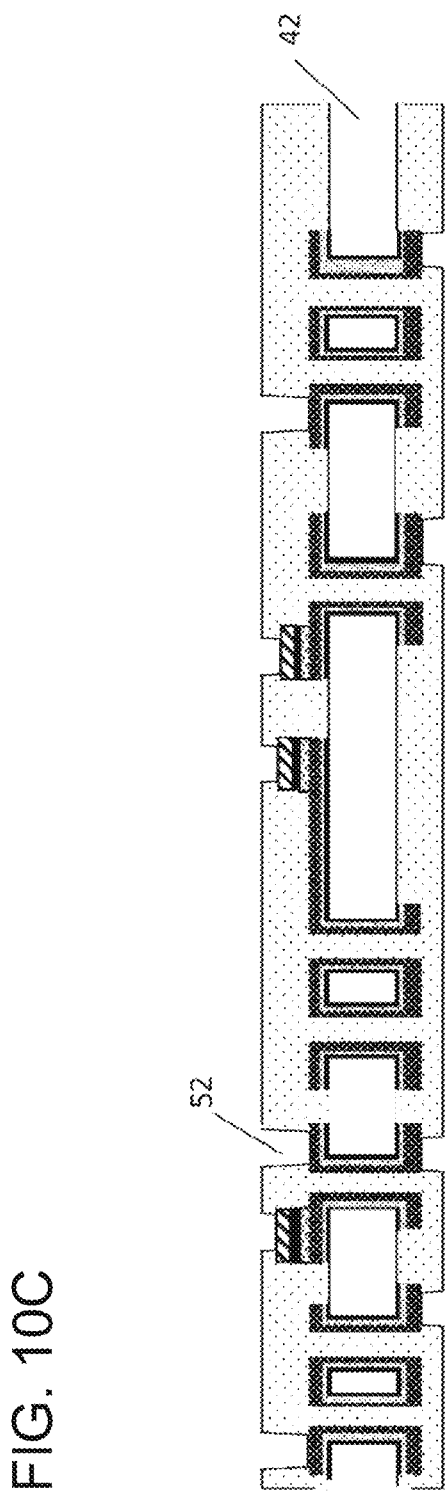
FIG. 10C is a view illustrating a manufacturing process of a circuit board according to an embodiment of the present invention.

Further, the insulating resin layer 51 is processed by laser at a position where electric conduction is desired to thereby form a hole (via hole) 52 that reaches the wiring layer of the glass core as shown in FIG. 10C. The hole 52 preferably has a diameter of approximately 60 μm.

Although not shown, the insulating resin layer 51 of the front and rear surfaces of the glass core 42 is processed with an alkaline-based surface roughening solution to thereby adjust the arithmetic surface roughness Ra to 60 nm. The purpose of the processing is to increase the adhesion of the seed layer in the next step.

Figure 11A:
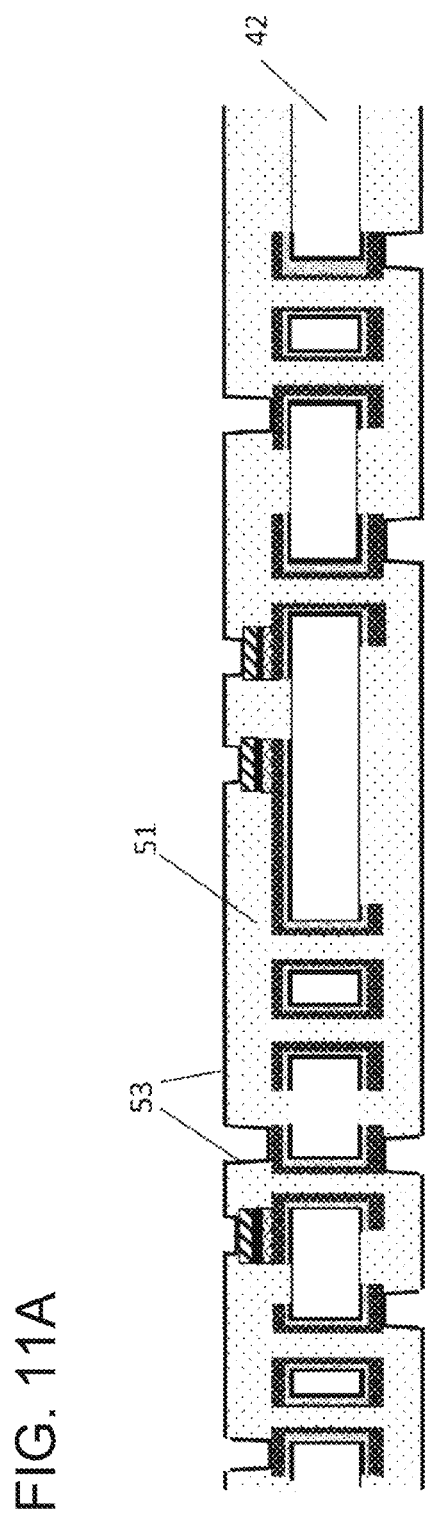
FIG. 11A is a view illustrating a manufacturing process of a circuit board according to an embodiment of the present invention.

Next, as shown in FIG. 11A, the insulating resin layer 51 on the front and rear surfaces of the glass core 42 is subjected to an electroless copper plating to form a conductive seed layer 53. The thickness is preferably 0.6 μm. With this processing, the conductive seed layer 53 is formed not only on the front and rear surfaces but also on the inner wall of the via hole 52 that has been previously formed by laser processing.

Figure 11B:
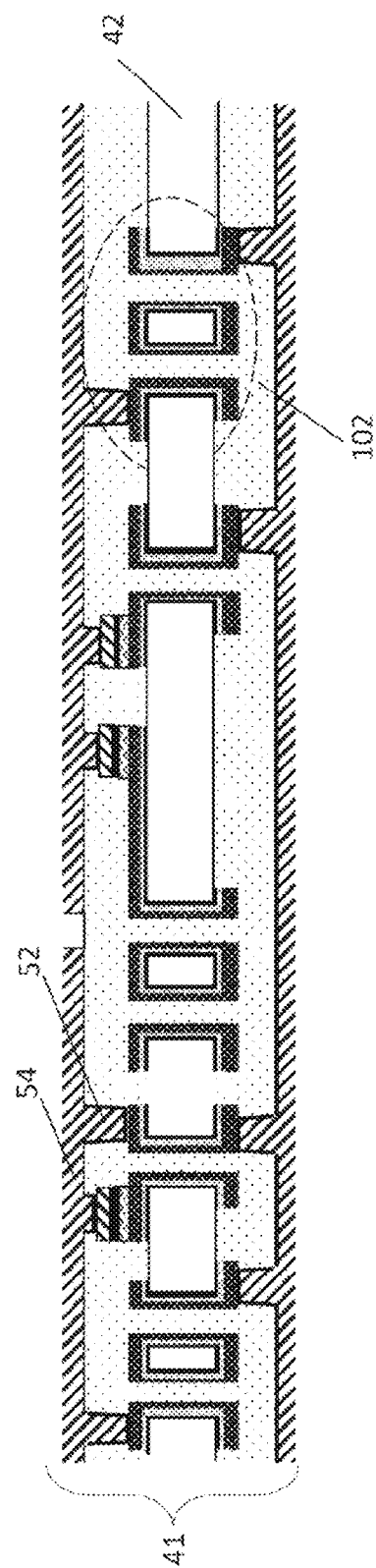
FIG. 11B is a view illustrating a manufacturing process of a circuit board according to an embodiment of the present invention.

Then, although not shown, a dry film resist is attached to both surfaces of the substrate, and an opening is formed by photolithography at positions where wirings 54 are to be provided. Then, as shown in FIG. 11B, electrolytic plating is applied to the substrate to form wirings 54 having the thickness of 15 μm. Further, in the electrolytic plating, the via hole 52 in the insulating resin layer 51 is filled with copper, and is electrically connected to the conductor layer on the surface of the glass core 42.

Then, unnecessary portions of the conductive seed layer are removed by etching. Thus, a basic circuit board 41 provided with the built-in elements for the LC circuit is completed. The circuit board 41, having the total thickness of 0.5 mm or less, can be suitably used for thin mobile communication devices and the like. In the figure, the built-up wiring on the underside of the glass core 42 is shown as if it has a copper layer, which serves as a ground for the capacitor and inductor incorporated in the circuit board. However, this is not necessarily required for an actual circuit board as long as predetermined capacitors and inductors are grounded when the circuit board is completed.

Figure 12A:
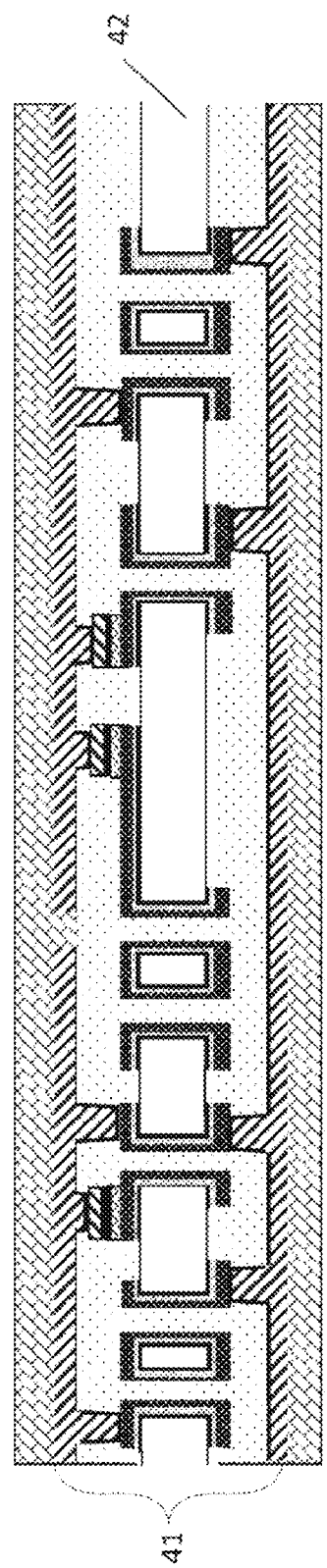
FIG. 12A is a view illustrating a manufacturing process of a circuit board according to an embodiment of the present invention.
Figure 12B:
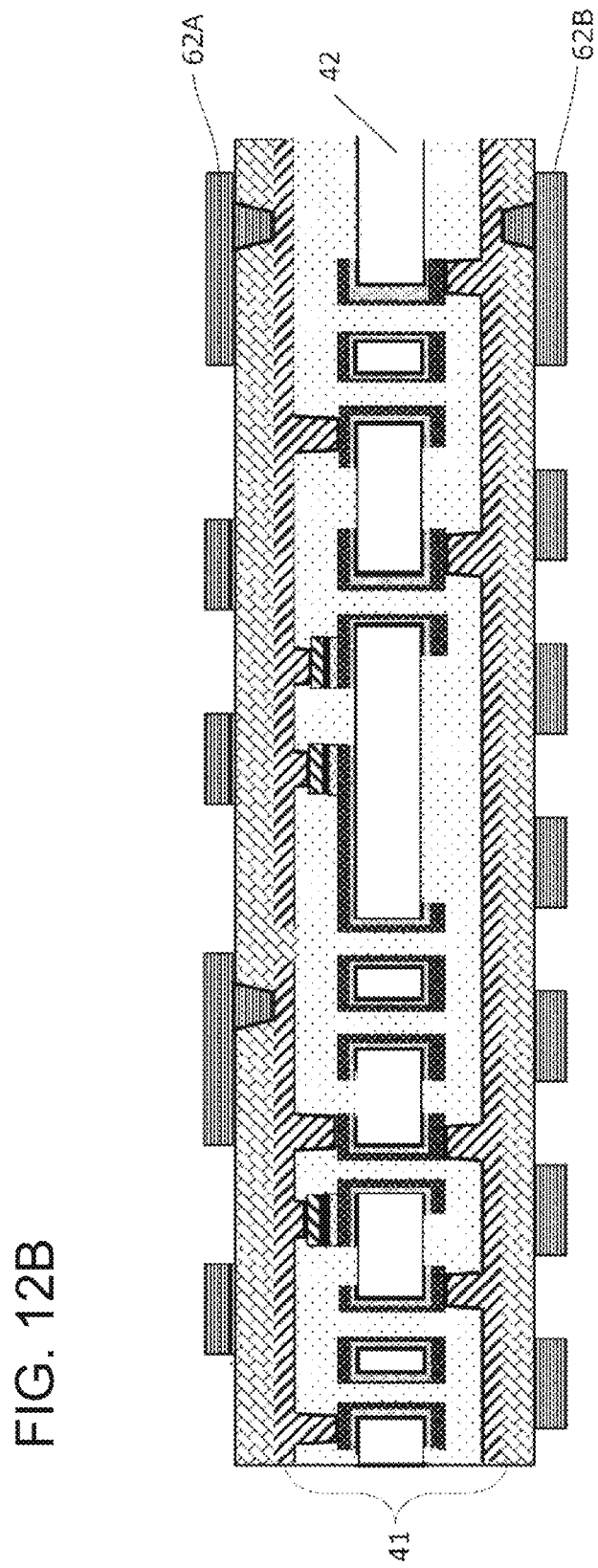
FIG. 12B is a view illustrating a manufacturing process of a circuit board according to an embodiment of the present invention.

Then, if necessary, the steps of FIG. 10B to FIG. 11B are repeated to laminate the insulating layer 61, and conductor wiring layers 62A and 62B, which are electrically connected to the wiring 54, as shown in FIGS. 12A and 12B so that electronic components are mounted. Further, a spiral coil element (coil) having a flat shape (for example, spiral shape) can be formed on a surface of the glass core 42 or the insulating resin layer 51. Further, an electrically neutral through hole can be formed between the solenoid coil elements to reduce losses due to mutual induction, and a capacitor can further be provided in the through hole.

Further, when the conductor pattern 46 made of copper is laminated on the glass core 42, a silicon nitride layer or the like can be provided, for example, directly on the glass core 42 in order to prevent occurrence of warpage or cracking of the glass core 42 due to imbalanced stress. The silicon nitride layer has a function of cancelling the residual stress by the copper conductor pattern 46. Thus, a built-up wiring layer in which the stress is adjusted can be provided by this combination. However, it should be noted that the silicon nitride is merely an example, and is not limited thereto.

Further, with reference to FIGS. 13 to 16, a process of mounting the circuit board of the present embodiment on a mother board, and mounting electronic components on the circuit board 41 will be described.

Figure 13:
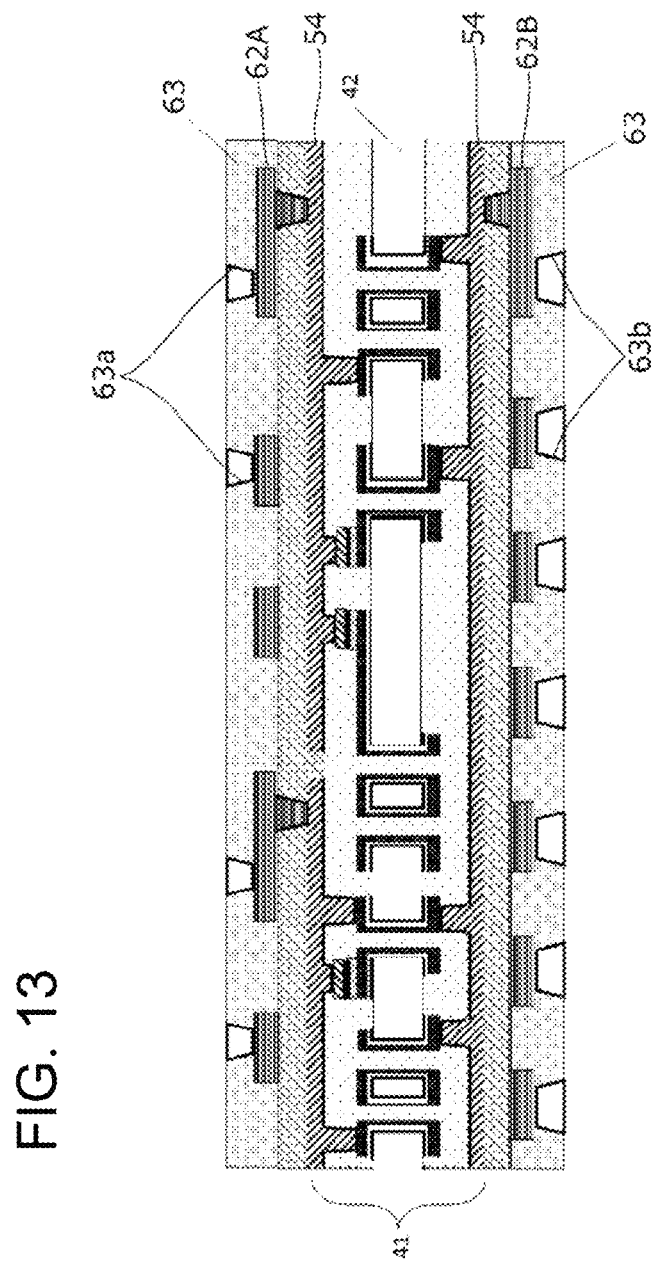
FIG. 13 is a view illustrating a mounting process in which electronic components are mounted on a circuit board, which is in turn mounted on a mother board.

First, as shown in FIG. 13, a solder resist 63 is applied to both surfaces of the circuit board 41 of FIG. 12B into a pattern shape by screen printing or the like. In this step, holes 63a and 63b are formed in the solder resist 63 such that the upper conductor wiring layer (first terminal) 62A and the lower conductor wiring layer (second terminal) 62B, respectively, are exposed to the outside. Further, part of the lower conductor wiring layer 62B is electrically insulated from the wiring 54 (that is, circuit) of the circuit board 41.

Figure 14:
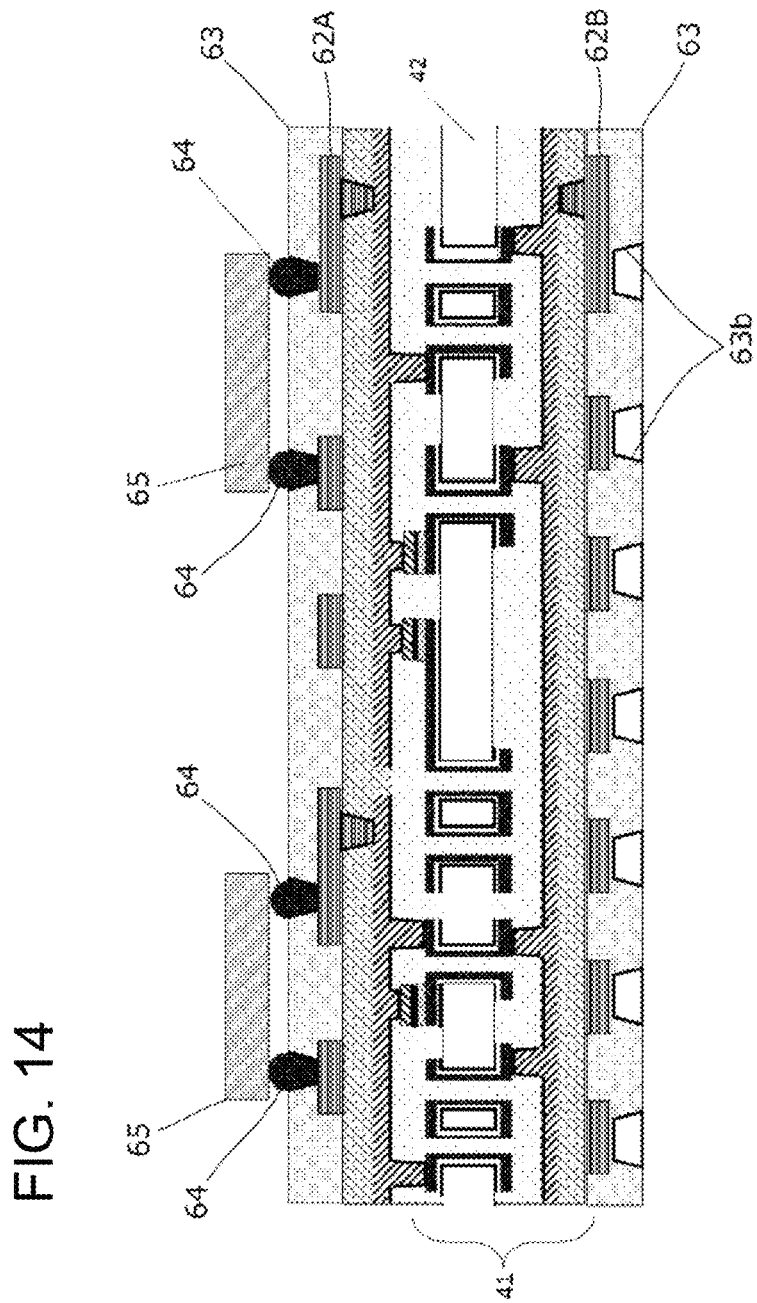
FIG. 14 is a view illustrating a mounting process in which electronic components are mounted on a circuit board, which is in turn mounted on a mother board.

Then, as shown in FIG. 14, solder bumps 64 are placed on the holes 63a on the upper surface of the circuit board 41, and the electronic components 65 are further placed on the solder bumps 64 with the electrically conductive portion being in contact thereto. Examples of the electronic components 65 include, but are not limited to, switches, amplifiers, filters, and the like.

Figure 15:
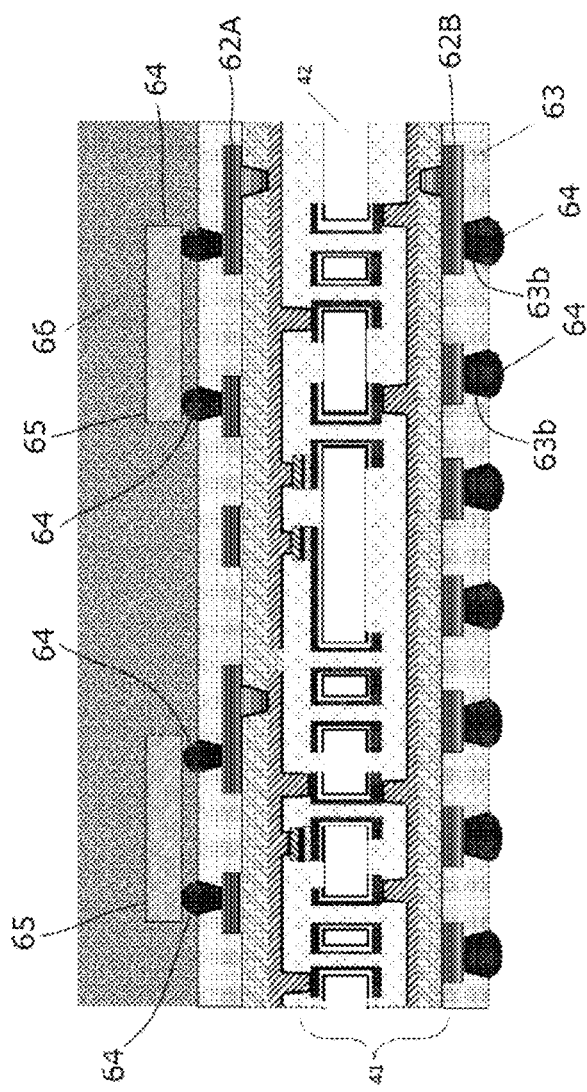
FIG. 15 is a view illustrating a mounting process in which electronic components are mounted on a circuit board, which is in turn mounted on a mother board.

Then, as shown in FIG. 15, the entire upper surface of the circuit board 41 including the electronic components 65 is covered with a mold resin 66. Further, the solder bumps 64 are placed on the holes 63b on the lower surface of the circuit board 41.

Figure 16:
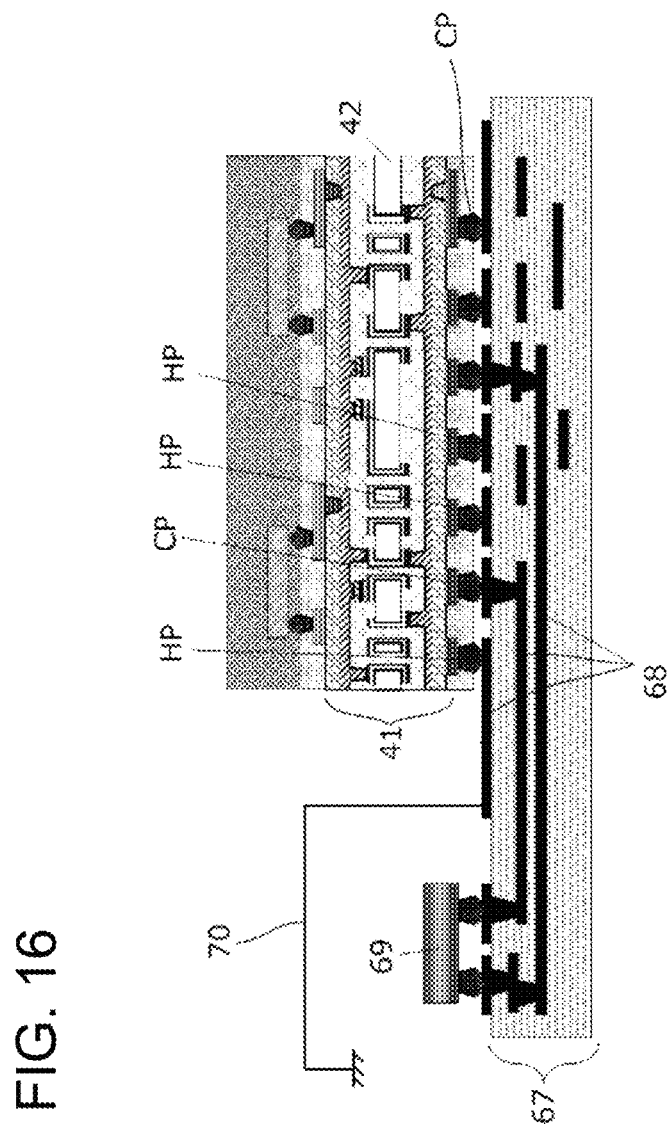
FIG. 16 is a view illustrating a mounting process in which electronic components are mounted on a circuit board, which is in turn mounted on a mother board.

As shown in FIG. 16, the circuit board 41 thus formed is placed on another circuit board, which is referred to as a mother board 67, and then placed into a reflow furnace (not shown). As a consequence, the solder bumps 64 in the holes 63b are melted so that part of the conductor wiring layer 62B is electrically connected to the conductive pattern 68 of the mother board 67. Further, the solder bumps 64 in the holes 63a are melted so that the conductor wiring layer 62A is electrically connected to the electrically conductive portion of the electronic components 65. A distance between the adjacent holes 63a is set to the extent that solders flowing out at the time of melting does not interfere with each other.

In thin mobile communication devices which support the 5G communication standard, it is required to optimize transmission/reception in multiple frequency bands with one module. Accordingly, a plurality of electronic components including the LC frequency filters are preferably compactly mounted. According to the present embodiment, the circuit board 41, having a built-in LC frequency filter, can be provided with other electronic components 65 on one surface, and connected to the conductive pattern 68 of the mother board 67 on the other surface. By virtue of such an interposer function, functions can be integrated with a compact size.

Further, part of the conductor wiring layer 62B (referred to as a connection pad CP) is electrically connected to the circuit in the circuit board 41, whereas the remaining part of the conductor wiring layer 62B (referred to as a heat dissipation pad HP) is a dummy terminal, which is not electrically connected to the circuit in the circuit board 41. In the circuit module of the thin mobile communication devices which support the 5G communication standard, the amount of heat generation is expected to be excessive. However, since the glass core has lower thermal conductivity than that of resin, it is desired to take measures against heat generation.

Figure 17:
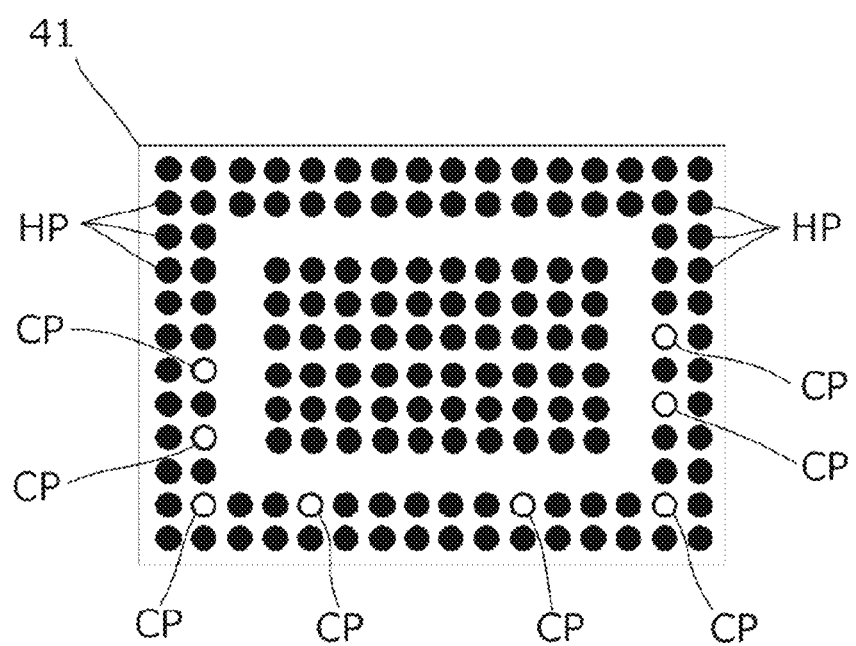
FIG. 17 is a schematic view of a circuit board viewed from the underside.

According to the present embodiment, the connection pads CP and the heat dissipation pads HP indicated by the white circles and black circles, respectively, are arranged in a mixed manner in two rows along the outer peripheral edge of the circuit board 41 as shown in FIG. 17 so that the heat dissipation pads HP promote heat dissipation from the circuit board 41. Preferably, more heat dissipation pads HP are provided than connection pads CP.

The heat dissipation pads HP are electrically connected via the solder bump 64 only to the conductive pattern 68, which are not electrically connected to the circuit of the mother board 67 and another components 69, to thereby achieve electrical insulation (isolation) while having enhanced heat dissipation effect. Alternatively, at least one heat dissipation pad HP may be grounded via a ground wire 70 (FIG. 16).

REFERENCE SIGNS LIST

11 . . . Insulating resin layer; 12 . . . Lower electrode of capacitor; 13 . . . Dielectric layer of capacitor; 14 . . . Conductor (upper electrode of capacitor); 21, 22 . . . Wiring; 23 . . . Through hole; 31 . . . Glass core; 32 . . . Insulating resin layer; 33 . . . Lower electrode; 34 . . . Upper electrode; 35 . . . Dielectric layer; 41 . . . Circuit board; 42 . . . Glass core; 43 . . . Through hole; 44 . . . Adhesion layer (Ni/Cu sputter layer); 45 . . . Nickel plating (Ni) layer; 45' . . . Seed layer (Ni/Cu/Ni layer); 46 . . . Conductor pattern (copper wiring directly above glass: including lower electrode of capacitor; 47 . . . Dielectric layer; 48 . . . Seed layer (Ni/Cu sputter layer on dielectric layer); 49 . . . Upper electrode of capacitor; 50 . . . Dry film resist layer for capacitor protection; 51 . . . Insulating resin layer; 52 . . . Hole in insulating resin layer (via hole); 101 . . . Capacitor; 102 . . . Inductor; 202 . . . Transceiver LSI; 203 . . . Bandpass filter; 204 . . . Bandpass filter; 205 Bandpass filter; 206 . . . Bandpass filter; 207 . . . Bandpass filter; 208 . . . Switch; 209 . . . Amplifier; 210 . . . Baseband processor; 211 . . . Application processor; 212 . . . Diplexer; 213 . . . Diplexer; 214 . . . Antenna; 215 RF circuit; 302 . . . High-pass filter; 303 . . . TDD bandpass filter; 304 . . . TDD bandpass filter.

What is claimed is:

1. A circuit board, comprising:
a glass plate having a through hole; and
a plurality of circuit elements, wherein
a circuit made of a conductive member disposed on an inner peripheral wall of the through hole and a surface of the glass plate is provided,
a laminated circuit having an insulating member made of a resin is provided on at least a first surface of the glass plate, the laminated circuit being electrically connected to the circuit on the surface of the glass plate,
a first circuit element is a solenoid coil element disposed in a coil shape on the inner peripheral wall of the through hole and the surface of the glass plate,
a second circuit element is a capacitor element including a lower electrode formed of the circuit disposed on the surface of the glass plate or a lower electrode formed of the laminate circuit, a dielectric layer formed on the lower electrode, and an upper electrode formed on the dielectric layer,
the solenoid coil element and the capacitor element constitute at least one LC frequency filter,
a first terminal is formed on a first surface of the circuit board, and a second terminal is formed on a second surface of the circuit board, and,
the circuit or the laminated circuit on the first surface of the glass plate is configured to be electrically connected to at least one electronic component via the first terminal, and the circuit or the laminated circuit on a second surface of the glass plate is configured to be electrically connected to another circuit board via the second terminal, wherein the LC frequency filter is used for time division duplex transmission/reception communication in a frequency band at 2 GHz or higher in mobile communication.

2. The circuit board of claim 1, wherein the LC frequency filter has a function as at least one of a bandpass filter, a low-pass filter, a high-pass filter, and a diplexer.

3. The circuit board of claim 1, wherein a total thickness is 0.5 mm or lower.

4. The circuit board of claim 1, wherein the LC frequency filter is a bandpass filter having a passband of 50 MHz or greater.

5. The circuit board of claim 1, wherein a conductive connection pad that is electrically connected to the circuit or the laminated circuit on a surface of the glass plate, and a heat dissipation pad that is not electrically connected to the circuit, are formed on the second surface of the circuit board, and the connection pad is the second terminal.

6. The circuit board of claim 5, wherein the connection pad and the heat dissipation pad are connected to a conductive pattern of the another circuit board.

7. The circuit board of claim 5, wherein the heat dissipation pad is grounded.

8. A circuit board, comprising:
a glass plate having a through hole; and
a plurality of circuit elements, wherein
a circuit made of a conductive member disposed on an inner peripheral wall of the through hole and a surface of the glass plate is provided,
a laminated circuit having an insulating member made of a resin is provided on at least a first surface of the glass plate, the laminated circuit being electrically connected to the circuit on the surface of the glass plate,
a first circuit element is a solenoid coil element disposed in a coil shape on the inner peripheral wall of the through hole and the surface of the glass plate,
a second circuit element is a capacitor element including a lower electrode formed of the circuit disposed on the surface of the glass plate or a lower electrode formed of the laminate circuit, a dielectric layer formed on the lower electrode, and an upper electrode formed on the dielectric layer,
the solenoid coil element and the capacitor element constitute at least one LC frequency filter,
a first terminal is formed on a first surface of the circuit board, and a second terminal is formed on a second surface of the circuit board, and,
the circuit or the laminated circuit on the first surface of the glass plate is configured to be electrically connected to at least one electronic component via the first terminal, and the circuit or the laminated circuit on a second surface of the glass plate is configured to be electrically connected to another circuit board via the second terminal, wherein the LC frequency filter is a bandpass filter having a passband of 50 MHz or greater.

9. The circuit board of claim 8, wherein a total thickness is 0.5 mm or lower.

10. The circuit board of claim 8, wherein a conductive connection pad that is electrically connected to the circuit or the laminated circuit on a surface of the glass plate, and a heat dissipation pad that is not electrically connected to the circuit, are formed on the second surface of the circuit board, and the connection pad is the second terminal.

11. The circuit board of claim 10, wherein the connection pad and the heat dissipation pad are connected to a conductive pattern of the another circuit board.

12. The circuit board of claim 10, wherein the heat dissipation pad is grounded.

13. A circuit board, comprising:
a glass plate having a through hole; and
a plurality of circuit elements, wherein
a circuit made of a conductive member disposed on an inner peripheral wall of the through hole and a surface of the glass plate is provided,
a laminated circuit having an insulating member made of a resin is provided on at least a first surface of the glass plate, the laminated circuit being electrically connected to the circuit on the surface of the glass plate,
a first circuit element is a solenoid coil element disposed in a coil shape on the inner peripheral wall of the through hole and the surface of the glass plate,
a second circuit element is a capacitor element including a lower electrode formed of the circuit disposed on the surface of the glass plate or a lower electrode formed of the laminate circuit, a dielectric layer formed on the lower electrode, and an upper electrode formed on the dielectric layer,
the solenoid coil element and the capacitor element constitute at least one LC frequency filter, a first terminal is formed on a first surface of the circuit board, and a second terminal is formed on a second surface of the circuit board, and, the circuit or the laminated circuit on the first surface of the glass plate is configured to be electrically connected to at least one electronic component via the first terminal, and the circuit or the laminated circuit on a second surface of the glass plate is configured to be electrically connected to another circuit board via the second terminal, wherein a conductive connection pad that is electrically connected to the circuit or the laminated circuit on a surface of the glass plate, and a heat dissipation pad that is not electrically connected to the circuit, are formed on the second surface of the circuit board, and the connection pad is the second terminal.

14. The circuit board of claim 13, wherein the heat dissipation pad is grounded.

15. The circuit board of claim 13, wherein the LC frequency filter has a function as at least one of a bandpass filter, a low-pass filter, a high-pass filter, and a diplexer.

16. The circuit board of claim 13, wherein a total thickness is 0.5 mm or lower.

17. The circuit board of claim 13, wherein the connection pad and the heat dissipation pad are connected to a conductive pattern of the another circuit board.

* * * * *